United States Patent
Nasu

(10) Patent No.: US 9,164,130 B2
(45) Date of Patent: Oct. 20, 2015

(54) METHOD FOR MANUFACTURING A PROBE

(71) Applicant: Kabushiki Kaisha Nihon Micronics, Musashino-shi, Tokyo (JP)

(72) Inventor: Mika Nasu, Oita-ken (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 53 days.

(21) Appl. No.: 14/058,348

(22) Filed: Oct. 21, 2013

(65) Prior Publication Data

US 2014/0110372 A1    Apr. 24, 2014

(30) Foreign Application Priority Data

Oct. 23, 2012   (JP) ................. 2012-234066

(51) Int. Cl.
*H01B 13/00*   (2006.01)
*G01R 3/00*   (2006.01)
*G01R 1/067*   (2006.01)

(52) U.S. Cl.
CPC .............. *G01R 3/00* (2013.01); *G01R 1/06733* (2013.01)

(58) Field of Classification Search
None
See application file for complete search history.

(56) References Cited

U.S. PATENT DOCUMENTS

| | | | |
|---|---|---|---|
| 7,721,429 B2 | 5/2010 | Soma et al. | |
| 7,736,690 B2 | 6/2010 | Hirakawa et al. | |
| 7,862,733 B2 * | 1/2011 | Hayashizaki et al. | 216/11 |
| 2003/0222668 A1 * | 12/2003 | Hung et al. | 324/762 |
| 2008/0184559 A1 * | 8/2008 | Soma et al. | 29/874 |
| 2009/0173712 A1 * | 7/2009 | Lee et al. | 216/11 |
| 2009/0212798 A1 * | 8/2009 | Kasukabe et al. | 324/754 |
| 2009/0237099 A1 * | 9/2009 | Garabedian et al. | 324/754 |
| 2010/0050431 A1 * | 3/2010 | Suzuki et al. | 29/874 |

FOREIGN PATENT DOCUMENTS

| | | |
|---|---|---|
| JP | 2008-164575 A | 7/2008 |
| JP | 2008-190885 A | 8/2008 |
| JP | 2008-191027 A | 8/2008 |
| TW | 200940999 A | 10/2009 |
| TW | 200951060 A | 12/2009 |

OTHER PUBLICATIONS

Official Action in Korean patent application 10-2013-0116331, dated Dec. 1, 2014.
Taiwanese Patent Office; Search Report in Taiwanese Patent Application No. 102133669 (Jun. 16, 2015).

* cited by examiner

*Primary Examiner* — Binh X Tran
*Assistant Examiner* — David Cathey, Jr.
(74) *Attorney, Agent, or Firm* — Leydig, Voit & Mayer, LTD.

(57) ABSTRACT

A method for manufacturing a probe, includes forming a recess on a sacrificial layer with a resist matching a plane pattern of the probe and a fixing tab connected to the probe, the recess exposing the sacrificial layer, which is on a baseboard, forming the probe and the fixing tab connected to the probe by depositing a probe material in the recess, and removing the resist, removing a portion of the sacrificial layer in an etching process. The portion of the sacrificial layer under the probe is fully removed, while the portion of the sacrificial layer under the fixing tab is left to provide support portions of the sacrificial layer under the fixing tab. Then the probe is removed from the baseboard.

17 Claims, 17 Drawing Sheets

METHOD FOR MANUFACTURING A PROBE

CROSS-REFERENCE TO THE RELATED APPLICATION

The entire disclosure of Japanese Patent Application No. 2012-234066, filed on Oct. 23, 2012, including specification, claims, drawings, and summary, on which the Convention priority of the present application is based, is incorporated herein in its entirety.

FIELD OF THE INVENTION

This invention relates to a method for manufacturing a probe.

BACKGROUND

Semiconductor integrated circuits (ICs) are formed in a plurality on a semiconductor wafer, and are then separated into individual chips for practical use. The ICs are normally subjected to an electrical test for evaluating the performance in advance of the separation into individual chips.

In this electrical test, a probe such as a probe card provided with a plurality of probes to be electrically connected to electrodes of respective device under the test, such as the above ICs, that is, an electrically connecting device is used, and the device under test are connected to a tester, as a testing means, through the electrically connecting device.

One of known probes used for the electrically connecting device is one that includes a plate-like probe body, an arm section provided in the probe body, and a probe tip section, which is provided at the tip of the arm section and is brought into contact with the electrode of a device under the test (see, for example, JP 2008-190885 A). By forming the probe body from a sturdy yet flexible metal material, when the probe tip section is pushed on the electrode of a device under the test, it is possible to cause the probe tip to slide on the electrode of the device under the test in accordance with elastic deformation of the arm section. Due to the slide of the probe tip, it is possible that the oxide film on the electrode of the device under the test will be scratched. That is, by applying an overdrive action, which causes the probe body to be elastically deformed, and thus, it becomes possible for the probe to come into contact and to remove the oxide film on the electrode by means of the probe tip and to obtain a reliable electrical contact therebetween.

Probes like this are formed in the following manner. First, a silicon wafer is prepared as a baseboard, and a plane pattern of the entire probe area is replicated on the baseboard using a photoresist through a photolithographic technique. Next, a desired material is deposited on a recess of the baseboard, which has been replicated using the photoresist. Then, the probes can be manufactured by being removed from the baseboard after having been formed thereon as disclosed in, for example, JP 2008-164575 A and JP 2008-191027 A.

In order to remove the formed probes from the baseboard, an etching technique is utilized. On the baseboard, there is formed, for example, a sacrificial layer composed of a metal material such as, for example, copper or the like, different from the material of the probes, and the probe material is deposited on the sacrificial layer. By removing the sacrificial layer by means of, for example, wet etching using an etching liquid, the formed probes can be removed from the baseboard by peeling.

However, since plural probes are collectively formed on the baseboard, if an etching process is performed until the sacrificial layer under the probes is completely removed, the plural minute probes may float in the etching liquid, which causes difficulty in the handling thereof.

It is therefore desirable to complete the etching process for forming the probes at the state in which the sacrificial layer remains at an appropriate minimum area between the probes and the baseboard as support portions, which serves for removing the probes easily. In that case, the probes remaining on the baseboard can be respectively removed by being peeled off using a tool.

In that case, however, if the time spent for the etching process described above is short, there remains a large quantity of the sacrificial layer between the probes and the baseboard as support portions. A strong force is required to peel off the probes adhered on the baseboard due to the remaining large quantity of sacrificial layer (support portions). In addition, such a process may deform the probes.

For this reason, there is a known method in which, when forming probes on a baseboard, the recess on the baseboard, replicated using a photoresist, is configured in a predetermined shape, and the probes and fixing tabs connected thereto for fixing the probes are integrally formed by depositing the probe material on the recesses, as disclosed in JP 2008-191027 A.

FIGS. 1A and 1B are drawings for explaining a known method for manufacturing a probe; FIG. 1A is a plan view schematically showing a probe and a fixing tab, and FIG. 1B is a cross-sectional view schematically showing the probe and the fixing tab on a baseboard.

In FIGS. 1A and 1B, the shape of a probe 1001 is schematically illustrated for the sake of convenience.

As shown in FIG. 1A, the probe 1001 and a fixing tab 1002 connected to the probe 1001 via a connecting portion 1004 are formed on a baseboard (not shown in FIG. 1A).

In this known method for manufacturing the probe 1001, the sacrificial layer between the probe 1001 and the baseboard 1005 is fully removed without any of the sacrificial layer remaining by means of the etching process described above, and at the same time only one sacrificial layer portion having predetermined pattern and area is left between the baseboard 1005 and the fixing tab 1002 as a support portion 1003, as shown in FIG. 1B. The fixing tab 1002 has a plane pattern that is suitable to leave the sacrificial layer portion under the fixing tab 1002 when the sacrificial layer under the probe 1001 is removed through the etching process. Consequently, in the known method for manufacturing the probe 1001, the etching process is performed such that, with respect to the respective probes 1001 on the baseboard 1005, only one support portion 1003 is left between the baseboard 1005 and the fixing tab 1002 connected to each of the probes 1001.

After that, in the known method for manufacturing the probes 1001, each of the probes 1001 is separated from the fixing tab 1002 supported by the support portion 1003 on the baseboard 1005. The separation of the probe 1001 is implemented by decoupling the connecting portion 1004 at a predetermined position as schematically illustrated with a dotted line in FIG. 1A. As a result, the probe 1001 can be removed from the baseboard 1005 without undergoing damage during the peeling process described above.

However, in the known method for manufacturing a probe, it occasionally happens that stresses arising in a probe and/or fixing tab due to a heat treatment and the like performed during the process of manufacturing probes concentrate onto the fixing tab causing the fixing tab to become warped. As a result, it has occurred that the probe formed on a baseboard has peeled off and dropped from the baseboard in a state of still being connected with the fixing tab, which has caused the yield of manufacturing probes to be lowered.

A method for manufacturing a probe is therefore desired that enables reduction in the occurrence of the dropping of the probes, which have been formed on a baseboard, from the baseboard during the manufacturing process.

The present invention has been performed in view of the problem of dropping of probes from a baseboard, which happens in the known method for manufacturing a probe.

An object of the present invention is therefore to provide a method for manufacturing a probe that reduces the occurrence of the dropping of probes from a baseboard.

Other challenges and advantages of the present invention are apparent from the following description.

SUMMARY OF THE INVENTION

According to the present invention, a method for manufacturing a probe, comprising, forming a recess on a sacrificial layer with a resist so as to match a plane pattern of the probe and a fixing tab connected to the probe, the recess causing the sacrificial layer placed on a baseboard to be exposed, forming the probe and the fixing tab connected to the probe by depositing a probe material in the recess, removing the resist, removing a portion of the sacrificial layer by an etching process, wherein the portion of the sacrificial layer under the probe is fully removed, while the remaining portion of the sacrificial layer under the fixing tab provide a plurality of support portions of the sacrificial layer under the fixing tab as supports supporting the probe and the fixing tab on the baseboard, and removing the probe from the baseboard.

DETAILED DESCRIPTION OF THE EMBODIMENTS

A plurality of probes of an embodiment of the present invention, which are each manufactured by the method for manufacturing a probe of the invention, constitute an electrical connection device by being used as probe like a probe card and can be used for electrical connection of a device under test such as an IC.

Figure 2:
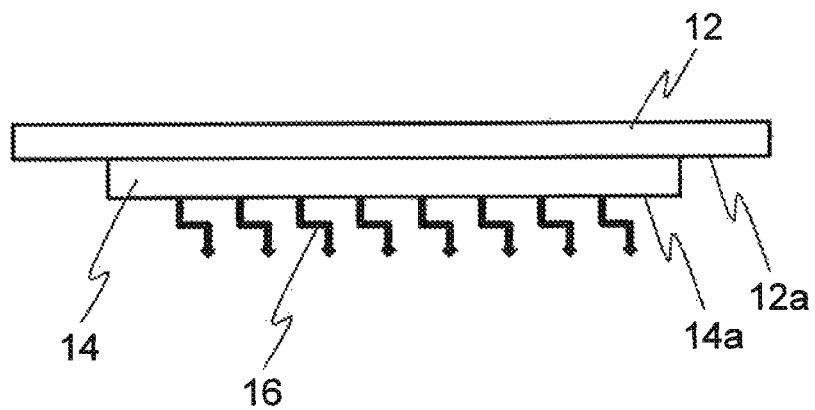
FIG. 2 is a cross-sectional view schematically showing probe of an embodiment of the invention.

FIG. 2 is a cross-sectional view schematically showing probe of an embodiment of the invention.

As shown in FIG. 2, the probe 10 of this embodiment comprises a wiring substrate 12 the plane shape of which is a circle as a whole, a probe substrate 14 attached to the middle portion of the undersurface 12a of the wiring substrate 12 and having a rectangular plane shape, and a plurality of probes 16 attached to one side surface 14a of the probe substrate 14.

Each of the probes 16 is fixed to a connection part (not shown) of a corresponding current-carrying path (not shown) formed on the one side surface 14a of the probe substrate 14. The other surface of the probe substrate 14 opposite to the surface 14a having the probes thereon is disposed to the undersurface 12a of the wiring substrate 12.

The wiring substrate 12 is composed of an electrical insulating material having the current-carrying paths (not shown) incorporated therein. In the upper peripheral portion of the wiring substrate 12, there are provided a plurality of tester lands (not shown) that are connection ends to a tester (not shown). Each of the probes 16 of the probe substrate 14 attached to the wiring substrate 12 is electrically connected to the corresponding tester land of the wiring substrate 12 via the corresponding current-carrying paths in the probe substrate 14 and wiring substrate 12 Each of the probes 16 is thereby electrically connected to the tester via the corresponding tester land of the wiring substrate 12.

Figure 3:
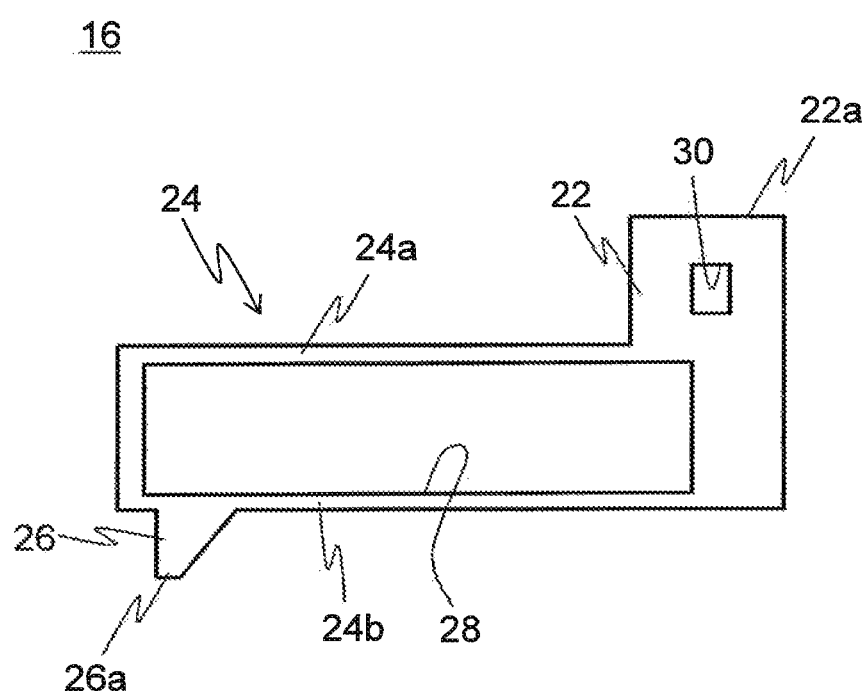
FIG. 3 is a plan view schematically showing the probe of the embodiment of the invention.

FIG. 3 is a plan view schematically showing the probe of the embodiment of the invention.

Since FIG. 3 is an exemplary schematic view of the probe 16 of this embodiment, separation remains, that is, the remnants of the sacrificial layer formed in between with a fixing tab, which will be described later, are omitted in the drawing.

The probe 16 of this embodiment has a flat shape that is a plate-like shape, as a whole. The probe 16 comprises a body 22 having an attachment end 22a attached to an engagement portion provided in the probe substrate 14 (not shown in FIG. 3), an arm section 24 extending laterally from the lower end of the body 22, and a probe tip section 26 extending longitudinally, i.e., downwardly from the tip of the arm section 24, and has a contact end 26a formed at the top end of the probe tip section 26. Although the separation remains, that is, the remnants of the sacrificial layer remaining on a side portion of the body 22 in between with the fixing tab, the illustration thereof is omitted.

The arm section 24 in the illustrated example has an opening 28 provided in the thickness direction of the probe 16 between the body 22 and the probe tip section 26, and extending in the longitudinal direction of the arm section 24. Due to the opening 28, the arm section 24 is partitioned into a pair of arm portions 24a, 24b apart from each other in parallel. The opening 28 in the illustrated example is formed such that one end thereof reaches the body 22.

In the body 22, there is also formed another opening 30 provided in the thickness direction of the probe 16.

Although the probe 16 of this embodiment of the invention can be configured without being provided with the opening 28 of the arm section 24, it is favorable to form the opening 28 as illustrated and to construct the arm section 24 from the arm portions 24a, 24b partitioned by the opening 28 so that appropriate elasticity can be given to the arm section 24 when the probe 16 is pressed on a device under test (not shown).

Likewise, although the probe 16 of this embodiment can be configured without being provided with the opening 30 in the body 22, since the opening 30 is effective in removal of the sacrificial layer under the body 22 by means of an etching process in the step of manufacturing the probes 16 (described later), it is favorable to form the opening 30 in the body 22.

The contact end 26a of the probe 16 of this embodiment is pressed on an electrode of the device under test for an electrical inspection of device under test such as, for example, ICs using a tester as described above. At this time, the contact end 26a of the probe 16 is reliably connected to the electrode of the device under test (not shown) with appropriate elasticity due to bending deformation of the both arm portions 24a, 24b.

A plurality of the probes of this embodiment having the exemplified construction can be manufactured collectively on a baseboard made of, for example, a silicon crystal substrate according to the method for manufacturing a probe of the present invention.

The method for manufacturing a probe of the embodiment comprises the following five steps.

The first step consists of forming a recess on a sacrificial layer placed on the surface of a baseboard using a resist so as to match a plane pattern of a probe and a fixing tab connected to the probe.

The second step consists of forming the probe and fixing tab connected to the probe by depositing a probe material in the recess formed using the resist.

The third step consists of removing the resist on the baseboard.

The fourth step consists of removing the sacrificial layer through an etching process except for one portion of the sacrificial layer, and forming the probe and fixing tab that are supported by the remaining one portion of the sacrificial layer on the baseboard.

The fifth step consists of removing the probe from the baseboard.

According to the method for manufacturing a probe of the present embodiment, in the second step in which a probe material composing the probe is deposited, a fixing tab connected to the probe is formed together with the probe. Then, after the resist is removed in the third step, the probe and fixing tab supported by one portion of a sacrificial layer are formed through the etching process in the fourth step. At that time, since the sacrificial layer under the probe has been removed in the final stage of the fourth step, the one portion of the sacrificial layer remains only under the fixing tab. After the fourth step, the probe is therefore supported through the medium of the fixing tab connected thereto, which is supported by the remaining portion of the sacrificial layer. The probe formed in the second step is in a state of floating above the baseboard after the fourth step.

Accordingly, in the fifth step, a process of peeling the probe off from the baseboard using a strong force becomes unnecessary, and the probe can be decoupled from the fixing tab, for example, by breaking the weak connecting portion between the probe and the fixing tab to be removed from the baseboard.

The method for manufacturing a probe of the present embodiment comprising the above respective steps provides the probe and fixing tab connected to the probe, which are formed in the fourth step, with a feature that is missing in known techniques.

Figure 1A:
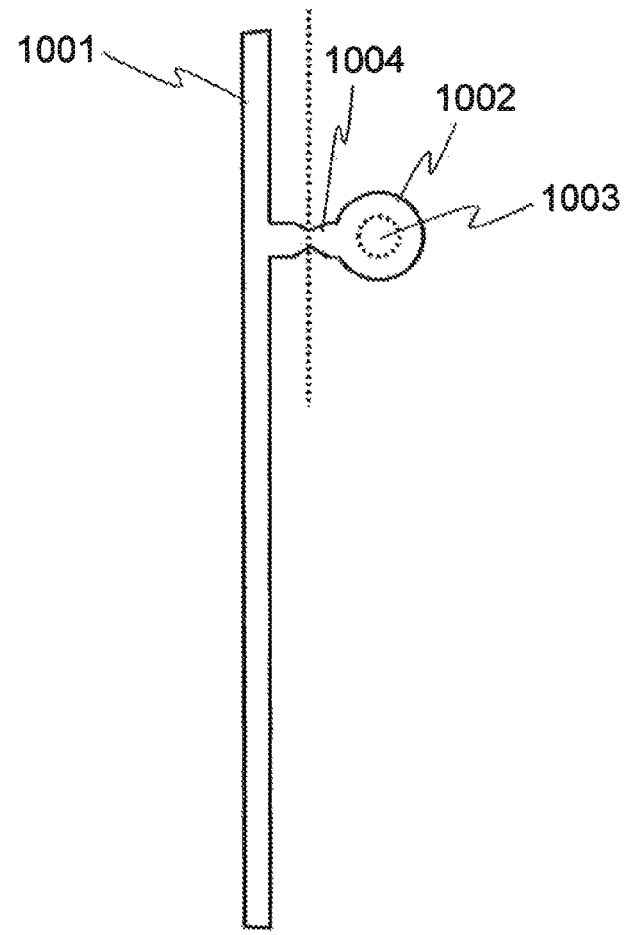
FIG. 1A is a plan view schematically showing a probe and a fixing tab.
Figure 1B:
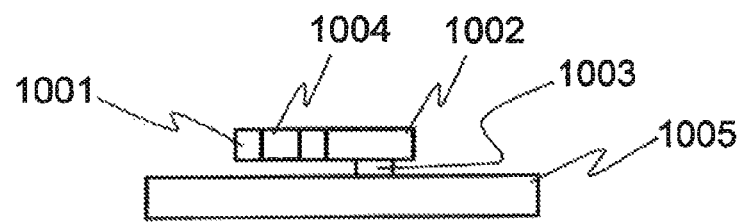
FIG. 1B is a cross-sectional view schematically showing the probe and the fixing tab on a baseboard.

That is, in the known method presented in FIGS. 1A and 1B, one portion of a sacrificial layer remains between a fixing tab 1002 connected to a probe 1001 and a baseboard 1005 as a single support portion 1003, and a structure is formed in which the fixing tab 1002 is supported only by the single support portion 1003 on the baseboard 1005. This single support structure results in that stresses arising due to being heated or the other causes concentrate onto the single support portion 1003 and a warp is generated.

On the other hand, in the method for manufacturing a probe of the present embodiment as opposed to the known method, a fixing tab connected to a probe is supported by two, three, or more plural support portions separated from each other in between the fixing tab and the baseboard. Consequently, even if stresses arise in the fixing tab, the stresses do not concentrate onto one support portion. The stresses can be dispersed into the connecting portion between the plural support portions of the fixing tab, which prevents occurrence of a warp and the like in the fixing tab. As a result, the method for manufacturing a probe of the present embodiment prevents the probe from dropping off from the baseboard during manufacture thereof and enables the manufacture of probes at a high yield.

In the method for manufacturing a probe of the present embodiment, in order to enable to support the fixing tab by plural support portions, the fixing tab formed in the second step described above is newly configured and is not seen in known methods. For that reason, the method for manufacturing a probe of the embodiment provides the recess of the resist having a pattern matching the newly configured fixing tab in the first step.

The method for manufacturing a probe of an embodiment of the present invention will be described below in detail. It is noted that although a plurality of probes can be manufactured collectively on a baseboard according to the method for manufacturing a probe of this embodiment, manufacturing processes as to a single probe are illustrated in the exemplary drawings for convenience of simplifying the illustration and description.

In the method for manufacturing a probe of this embodiment, the configuration of a probe and fixing tab connected thereto through a connecting portion formed on a baseboard, which are manufactured in an intermediate stage, becomes a distinctive configuration unseen in known methods as described above. Particularly, the structure of the fixing tab on the baseboard is distinctive. Accordingly, although probes manufactured through the method for manufacturing a probe of this embodiment are configured, for example, as shown in FIG. 3, the configuration will be simplified and schematically illustrated in the drawings for convenience in explanation.

First Embodiment

The method for manufacturing a probe of the first embodiment of the present invention provides a configuration such that a probe and fixing tab connected to the probe on a baseboard, which are manufactured in an intermediate stage, are fixed on the baseboard through two-point support of the fixing tab arranged by two support portions. The method for manufacturing a probe of this first embodiment enables manufacture of, for example, probes 16 having the above configuration shown in FIG. 3 at a high yield.

FIGS. 4A to 4E are process drawings showing the method for manufacturing a probe of the first embodiment of the present invention.

Figure 4A:
FIGS. 4A to 4E are process drawings showing the method for manufacturing a probe of the first embodiment of the present invention.

In the method for manufacturing a probe of this first embodiment, in the first step, a silicon crystal substrate is prepared, the surface of which is mirror finished through an etching process, this silicon crystal substrate is used as a baseboard 32 as shown in FIG. 4A.

Then, a sacrificial layer 42 is formed on the baseboard 32, the baseboard being a silicon crystal substrate. The sacrificial layer 42 can be formed by, for example, a sputtering method using copper. In this case, in advance of growing the sacrificial layer 42, it is possible to form, for example, an adhesion layer (not shown) composed of nickel uniformly on the baseboard 32 by means of a sputtering method or the like in order to promote the growth of the sacrificial layer 42 composed of copper.

On the baseboard 32 or on the adhesion layer on the baseboard 32, copper, as an example, is appropriately deposited by means of a sputtering method or the like as described above. By depositing the copper or the like, there is formed the sacrificial layer 42 that is uniform in quality and thickness. The sacrificial layer 42 is also called a seed layer, and it is possible to use a material available for the etching process described later such as an alloy of copper and nickel, or the like, as opposed to the copper described above.

Next, a photoresist material composed of a photosensitive material is coated on the sacrificial layer 42 by means of, for example, a spin coat method of a uniform thickness. A uniform photosensitive resist layer (not shown) is thereby formed all over the baseboard 32. This resist layer is subjected to selective exposure by use of a mask (not shown) and is then developed. This mask has a pattern corresponding to a whole plane pattern including probes 16 and fixing tabs 36 each connected to the probe 16 via a first connecting portion 34 described later.

By transferring the pattern of the mask to the resist layer, a resist 46 provided with a recess 46a is formed on the baseboard 32. The recess 46a of the resist 46 has a plane pattern corresponding to the whole plane pattern composed of the probes 16 and fixing tabs 36 each connected to the probe 16 via the first connecting portion 34. The resist 46 has a resist pattern formed so as to expose the sacrificial layer 42 on the bottom surface of the recess 46a.

This recess 46a of the resist 46 has a portion corresponding to the probe 16 shown in FIG. 3 described above. The portion corresponding to the probe 16 has respective portions corresponding to the plane pattern of the body 22, arm section 24 (pair of arm portions 24a, 24b) and probe tip section 26 of the probe 16. Further, the resist 46 has a pattern formed for forming the opening 30 and opening 28 in the portions corresponding to the body 22 and arm section 24, respectively.

This recess 46a of the resist 46 also has respective portions corresponding to the plane pattern of the first connecting portion 34 and fixing tab 36 together with the portion corresponding to the probe 16. The fixing tab 36 is composed of a first support plate 51, second support plate 53 and second connecting portion 52 connecting therebetween as described using FIG. 5 when the second step is explained. In this step, the recess 46a of the resist 46 is therefore formed to correspond to the plane pattern of the fixing tab 36 composed of the first support plate 51, second support plate 53 and second connecting portion 52 connecting therebetween as well as formed to correspond to the plane pattern of the probe 16.

Figure 4B:
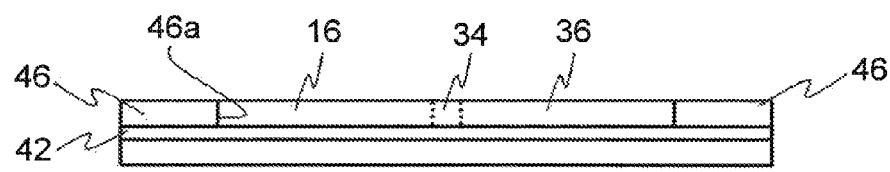
Figure 4C:

In the second step of the method for manufacturing a probe of this first embodiment, a probe material is deposited in the recess 46a of the resist 46 by means of, for example, electroforming (electroplating) as shown in FIG. 4B. As a result, in the recess 46a, there are formed the probe 16 and fixing tab 36 connected to the probe 16 via the first connecting portion 34 so as to be fixed on the sacrificial layer 42 in this step.

Figure 5:
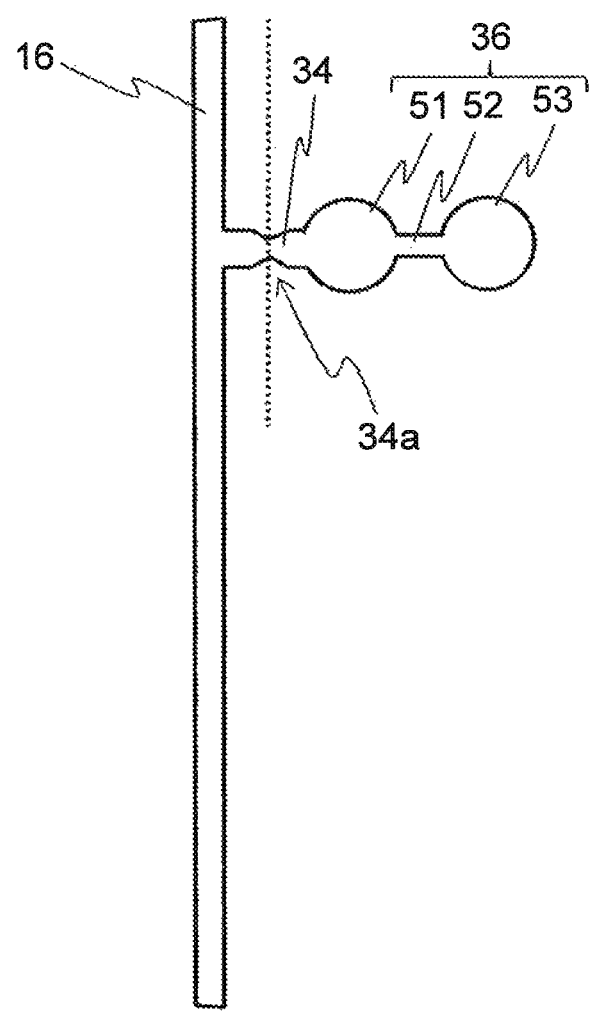
FIG. 5 is a drawing schematically showing the configuration of a probe, first connecting portion and fixing tab of the first embodiment of the invention.

FIG. 5 is a drawing schematically showing the configuration of a probe, first connecting portion and fixing tab manufactured by the method for manufacturing a probe of the first embodiment of the invention.

In FIG. 5, the pattern of the probe 16 is schematically illustrated. The fixing tab 36 is composed of the first support plate 51 connected to the probe 16 via the first connecting portion 34 and the second support plate 53 connected to the first support plate 51 via the second connecting portion 52, as shown in FIG. 5. That is, the fixing tab 36 is composed of the first support plate 51, second support plate 53 and second connecting portion 52 connecting therebetween. The first connecting portion 34 includes a weak portion 34a that has a narrower width as compared with the others and is detached at around the middle thereof when the probe 16 is separated from the fixing tab 36 in the fifth step described later. The fixing tab 36 is configured so as to be coupled to the side of the body 22 of the probe 16 shown in FIG. 3, opposite to the side on which the arm section 24 is formed, via the first connecting portion 34.

The first support plate 51 and second support plate 53 of the fixing tab 36 have plane patterns sufficient for portions of the sacrificial layer 42 under the first support plate 51 and second support plate 53 to remain, respectively, when the portion of the sacrificial layer 42 under the body 22 of the probe 16 is removed through the etching process in the fourth step of the method for manufacturing a probe of this embodiment (described later). For example, the first support plate 51 and second support plate 53 can be each configured so as to have an area larger than that of the body 22 of the probe 16 shown in FIG. 3. Incidentally, the area of the opening 30 is not included in the area of the body 22 in this case. The first support plate 51 and second support plate 53 each have an area larger than either of the first connecting portion 34 and second connecting portion 52.

In the first step of the method for manufacturing a probe of this embodiment described above, the recess 46a of the resist 46 shown in FIG. 4A is formed to correspond to the plane pattern of the body 22, arm section 24 (pair of arm portions 24a, 24b) and probe tip section 26 of the probe 16. Simultaneously, the recess 46a is also formed to correspond to the plane pattern of the fixing tab 36 that is coupled to the probe 16 and is composed of the first support plate 51, second support plate 53 and second connecting portion 52 connecting therebetween. As a result, at the second step of FIG. 4B, the first support plate 51 (not shown in FIG. 4B) and the second support plate 51 (not shown in FIG. 4B) of the fixing tab 36 having the above pattern are produced.

As the probe material, it is possible to use only one kind of material and also possible to use different kinds of materials in combination thereof. When using a metal material as the probe material, for example, it is possible to use a single metal and also to use an alloy. Specifically, metal materials used as the probe material may include single metals such as nickel, gold, silver, tin, zinc, rhodium, tungsten and the like; metal alloys including thereof such as a nickel-phosphorus alloy or the like; and composite metals composed of plural single metals and alloys.

Next, in the third step of the method for manufacturing a probe of this first embodiment, removal of the resist 46 is carried out after the probe 16, first connecting portion 34 and fixing tab 36 have been integrally formed on the sacrificial layer 42 in the second step.

Figure 4D:
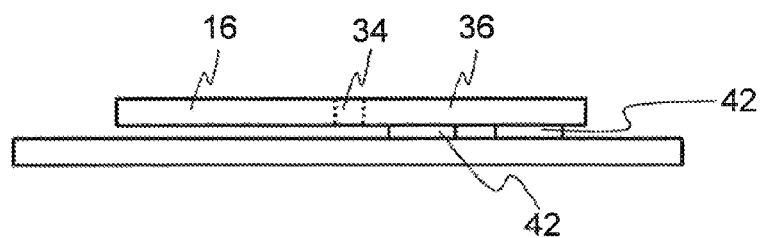

After the resist 46 has been removed, an etching process is performed in the fourth step of the method for manufacturing a probe of this first embodiment. In this fourth step, the etching process using an etching liquid (wet etching process) is applied so that the portion of the sacrificial layer 42 under the probe 16 is removed in order to take the probe 16 off from the baseboard 32. Due to this wet etching process, the portion of the sacrificial layer 42 exposed from the probe 16, first connecting portion 34 and fixing tab 36 erodes from the peripheral portions thereof as shown in FIG. 4D.

Figure 4E:
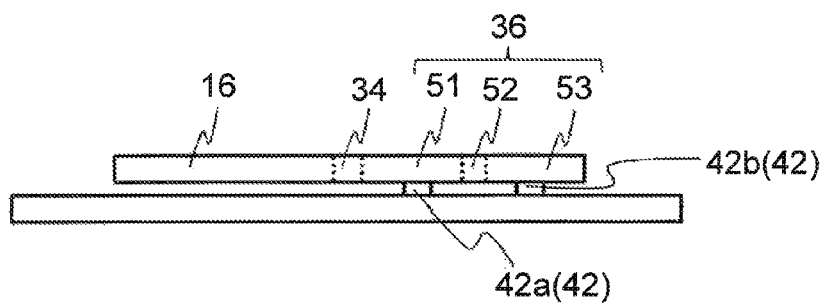

Due to the wet etching process further being continued in the fourth step of the method for manufacturing a probe of this first embodiment, the sacrificial layer 42 further erodes as shown in FIG. 4E.

In the etching process in the fourth step of the method for manufacturing a probe of this first embodiment, the erosion of the sacrificial layer 42 caused by the etching liquid proceeds from the peripheral portion of each of the probe 16, first connecting portion 34, and fixing tab 36 toward the middle portion thereof. At this time, the first support plate 51 and second support plate 53 of the fixing tab 36 each have a pattern larger than, for example, the area of the body 22 of the probe 16 shown in FIG. 3, as described above. Further, the first support plate 51 and second support plate 53 each have a pattern wider than either of the arm section 24 (pair of arm portions 24a, 24b) and probe tip section 26, and also each have an area larger than either of the first connecting portion 34 and second connecting portion 52 shown in FIG. 5.

As a result, although the portion of the sacrificial layer 42 under the probe 16 and first connecting portion 34 is removed, a sacrificial layer portion 42a under the middle portion of the first support plate 51 of the fixing tab 36 remains as shown in FIG. 4E. Likewise, a sacrificial layer portion 42b under the middle portion of the second support plate 53 also remains.

Figure 6A:
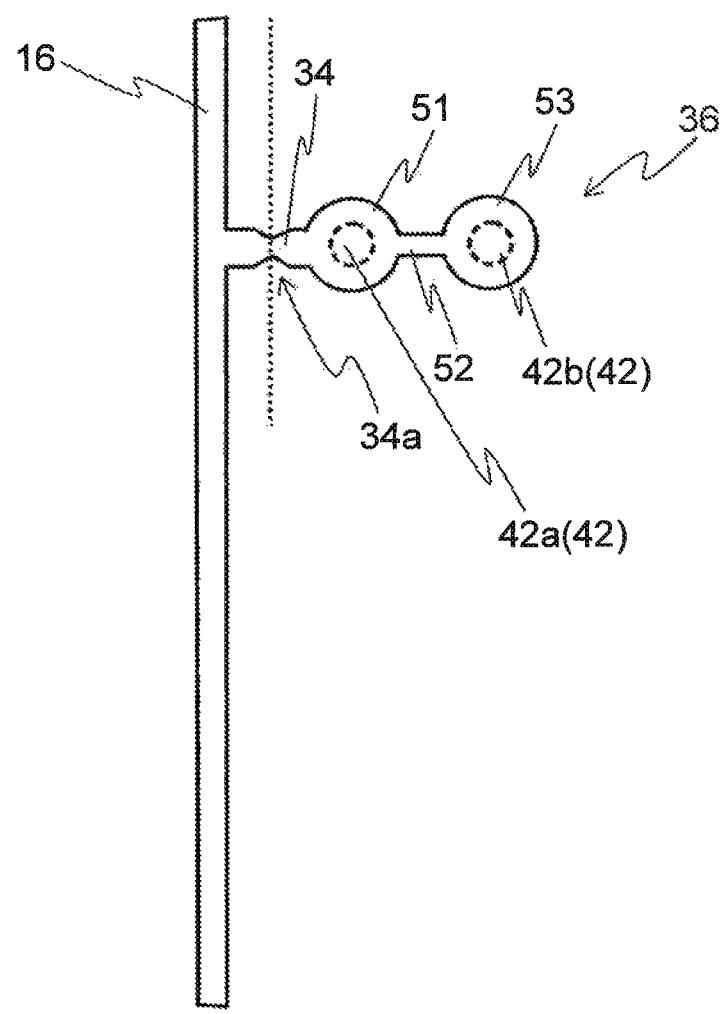
FIG. 6A is a plan view schematically showing the probe and fixing tab.
Figure 6B:
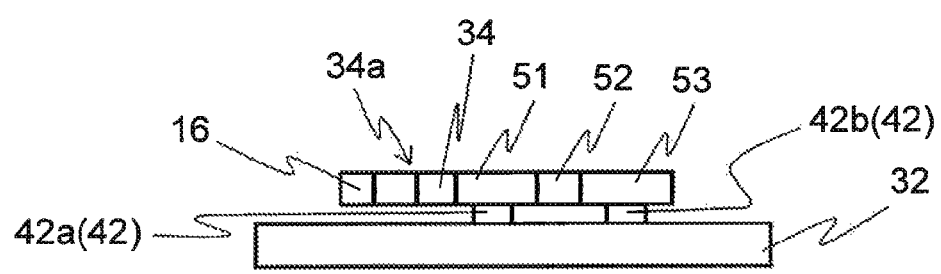
FIG. 6B is a cross-sectional view schematically showing the probe and the fixing tab on the baseboard.

FIGS. 6A and 6B are drawings explaining the probe and fixing tab on a baseboard manufactured in an intermediate stage of the method for manufacturing a probe of the first embodiment of the invention; FIG. 6A is a plan view schematically showing the probe and fixing tab, and FIG. 6B is a cross-sectional view schematically showing the probe and the fixing tab on the baseboard.

In the fourth step, the sacrificial layer 42 is partially removed through the etching process, and the remaining portions of the sacrificial layer 42 support the probe 16 and fixing tab 36 on the baseboard 32 as shown in FIGS. 6A and 6B.

In the state after the etching process has been completed, the probe 16 to be removed from the baseboard 32 floats above the baseboard 32 together with the first connecting portion 34, and the first support plate 51 of the fixing tab 36 connected to the first connecting portion 34 and the second support plate 53 are disposed onto the baseboard 32 via the remaining sacrificial layer portions 42a, 42b, as shown in FIGS. 4E and 6B.

That is, the fourth step is performed such that the portion of the sacrificial layer 42 under the probe 16 is fully removed, while the remaining sacrificial layer portions 42a, 42b are left under the first support plate 51 and second support plate 51 of the fixing tab 36, respectively. In the fourth step, the sacrificial layer portion 42a remaining under the first support plate 51 is designated to be a first support, and the sacrificial layer portion 42b remaining under the second support plate 53 is designated to be a second support; the probe 16 and fixing tab 36 are supported on the baseboard 32 by the two points of the first and second supports.

Accordingly, since the probe 16 is held on the baseboard 32 via the sacrificial layer portion 42a, being the first support, under the first support plate 51 of the fixing tab 36, and the sacrificial layer portion 42b, being the second support, under the second support plate 53, the probe 16 will not be detached from the baseboard 32.

The sacrificial layer portion 42a, being the first support, and the sacrificial layer portion 42b, being the second support, are formed under the first support plate 51 of the fixing tab 36 and under the second support plate 53 connected to the first support plate 51 via the second connecting portion 52, respectively. The first support plate 51 and second support plate 53 are provided so as to be apart from each other and are connected to each other by the second connecting portion 52. The sacrificial layer portion 42a, being the first support, and the sacrificial layer portion 42b, being the second support, are therefore disposed under the fixing tab 36 so as to be apart from each other.

By forming the sacrificial layer portion 42a under the first support plate 51 and the sacrificial layer portion 42b under the second support plate 53 as the two points of supports, even if stress arises in the fixing tab 36, the stress can be dispersed by the second connecting portion 52, which is designated to be the connecting portion between the first support plate 51 and second support plate 53.

For example, when the probe 16 is subjected to a heat treatment during the manufacture process thereof, it may happen that stresses arise in the sacrificial layer portions 42a, 42b, being two points of supports of the probe 16 and fixing tab 36. However, the stresses arising in the sacrificial layer portions 42a, 42b do not concentrate on those portions, but are able to be dispersed to the second connecting portion 52 via the first support plate 51 and second support plate 53, which are each connected thereto.

That is, in regard to the probe 16 and fixing tab 36 coupled thereto formed in an intermediate stage of the method for manufacturing a probe of this embodiment, the fixing tab 36 is supported on the baseboard 32 at the two points of supports by use of the sacrificial layer portions 42a, 42b. If stresses are applied to the sacrificial layer portions 42a, 42b supporting the fixing tab 36, the stresses can be dispersed to the portion connecting therebetween, by which occurrence of a warp is prevented and dropping of the probe 16 together with the fixing tab 36 from the baseboard 32 is therefore prevented. Consequently, reduction in the yield of manufacturing the probes 16 can be suppressed.

The sacrificial layer portion 42a, which is formed under the first support plate 51 and becomes the first support, and the sacrificial layer portion 42b, which is formed under the second support plate 53 and becomes the second support, can be shaped in various patterns. Particularly, the cross section of each of the sacrificial layer portions 42a, 42b in parallel with the baseboard 32 can be shaped in various patterns.

For example, the sacrificial layer portions 42a, 42b supporting the fixing tab 36 on the baseboard 32 are independently allowed to have any pattern chosen from a group consisting of a circle, ellipse, polygon and star as the shape of the cross section in parallel with the baseboard 32.

The sacrificial layer portions 42a, 42b are formed through the etching process of the fourth step as described above, and the shape of the sacrificial layer portions 42a, 42b, particularly the cross-sectional shape thereof therefore depends on the pattern of the first support plate 51 and second support plate 53 placed thereon. Accordingly, by controlling the pattern of the first support plate 51 and second support plate 53 of the fixing tab 36 formed in the second step, it becomes possible to control the cross-sectional shape of each of the sacrificial layer portion 42a, being the first support, and the sacrificial layer portions 42b, being the second support.

The pattern of the first support plate 51 and second support plate 53 of the fixing tab 36 formed in the second step is determined by the pattern of the recess 46a of the resist 46 in the first step shown in FIG. 4A. Accordingly, the cross-sectional shape of the sacrificial layer portions 42a, 42b can be formed by controlling the pattern of the recess 46a of the resist 46 in the first step as well as the etching process conditions in the fourth step.

That is, in the first step described above, the portion corresponding to the plane pattern of the fixing tab 36 in the recess 46a of the resist 46 can be formed such that the sacrificial layer portions 42a, 42b, which become the two points of supports through the etching process in the fourth step, are each composed to have the cross-sectional shape described above.

The sacrificial layer portion 42a, being the first support, and the sacrificial layer portions 42b, being the second support, can be formed such that the cross sections thereof in parallel with the baseboard 32 mutually have an identical area as shown in FIGS. 6A and 6B. By doing so, if stresses are applied to the sacrificial layer portions 42a, 42b supporting the fixing tab 36, the stresses can thereby be effectively dispersed to the portion connecting therebetween, i.e., the second connecting portion 52.

However, the cross-sectional areas of the sacrificial layer portion 42a, being the first support, and the sacrificial layer portions 42b, being the second support, are not necessarily equal to each other, and it is possible to form the sacrificial layer portions 42a, 42b the areas of the cross sections in parallel with the baseboard 32 of which are different with each other as long as the stresses described above can be dispersed.

At that time, in the first step described above, the portion corresponding to the plane pattern of the fixing tab 36 in the recess 46a of the resist 46 can be formed such that the sacrificial layer portions 42a, 42b, which become the two points of supports through the etching process in the fourth step, are composed to have respective desirable cross-sectional shapes. Accordingly, for example, the first support plate 51 and second support plate 53 have different areas and/or different shapes to each other.

Next, in the method for manufacturing a probe of this first embodiment, the probe 16 is removed from the baseboard 32. That is, in the method for manufacturing a probe of this first embodiment, after the etching process has been completed in the state in which the sacrificial layer portions 42a, 42b remain in the fourth step, the probe 16 is separated from the first support plate 51 of the fixing tab 36 and is taken off from the baseboard 32 as the fifth step (not shown in FIGS. 4A to 4E).

In this fifth step, it is possible to take the probe 16 off from the baseboard 32 without applying a strong peeling force (as described in the prior art) to the probe 16. The removal of the probe 16 from the fixing tab 36 is done in such a manner that the probe 16 is held using a tool such as, for example, tweezers, spatula, knife or the like from below, and is raised upward, supported by the tool. The narrowest width portion of the first connecting portion 34 shown in FIGS. 6A and 6B, i.e., the weak portion 34a formed in the first connecting portion 34 can thereby be broken. Incidentally, in the case in which the metal material composing the probe 16 is a magnetic substance, it is possible to use a magnet for handling the probe 16.

Although the method for manufacturing a probe of the first embodiment of the present invention enables prevention of the probe 16 from dropping from the baseboard 32 and manufacture of the probes 16 at a high manufacture yield, it is also possible to arrange a process for enhancing the strength of the probe 16 in an intermediate stage thereof.

For example, the method for manufacturing a probe of the first embodiment allows providing of a heating treatment in an intermediate stage in the fourth step. That is, it is possible to arrange a heating treatment after the etching process shown in FIG. 4D has been completed and before the next etching process shown in FIG. 4E will be performed. By applying a heat treatment to the probe 16 supported on the baseboard 32, the strength of the probe 16 can be enhanced.

At this time, there is a consideration that the probe 16 will become warped as a result of the heating treatment. Since this warping will result in a reduction in the yield of manufacture of the probes, a countermeasure thereto is required.

In order to prevent the probe 16 warping on the baseboard 32 due to a heat treatment or the like, the method for manufacturing a probe of the first embodiment allows an auxiliary support portion, which supports the probe 16 on the baseboard 32, to be provided. For example, it is possible to provide the auxiliary support portion in between the tip portion and baseboard of the arm section 24 having the probe tip section 26 of the probe 16 in FIG. 3.

This auxiliary support portion can be formed as one portion of the remaining sacrificial layer 42 when the sacrificial layer 42 under the probe 16 is removed through the etching process in the fourth step. By providing such an auxiliary support portion, the probe 16 is supported at two points apart from each other on the baseboard 32, and is prevented from becoming deformed.

In order to form an auxiliary support portion under the probe 16, for example, under the probe tip section 26 described above as one portion of the sacrificial layer 42, it is possible to perform a process of forming a new resist in advance of the etching process shown in FIG. 4D, and to form the auxiliary support portion remaining as one portion of the sacrificial layer 42 by suppressing the proceeding of etching due to protection by the resist. Then, the auxiliary support portion having been formed can be removed through the further etching process shown in FIG. 4E.

Through the five steps described above, the method for manufacturing a probe of the first embodiment of the present invention forms the two-point support by the two support portions apart from each other between the fixing tab 36 connected to the probe 16 and the baseboard 32 to prevent the probe 16 from dropping from the baseboard 32, and enables manufacture of the probes 16 at a yield.

For this reason, in the method for manufacturing a probe of this first embodiment, the fixing tab 36 connected to the probe 16 via the first connecting portion 34 on the baseboard 32 is constructed of the first support plate 51 connected to the first connecting portion 34, second support plate 53 and second connecting portion 52 connecting therebetween. In this case, the structure of the fixing tab 36 becomes important. Although the fixing tab 36 is exemplified in FIG. 5, FIGS. 6A and 6B, the structure of the fixing tab 36 is not limited to one shown in FIG. 5, FIGS. 6A and 6B in the method for manufacturing a probe of this first embodiment.

For example, the pattern of the second connecting portion 52 of the fixing tab 36 is not limited to the straight line pattern shown in FIGS. 6A and 6B, but can be configured in a curve or a combination of straight line and curve.

Figure 7:
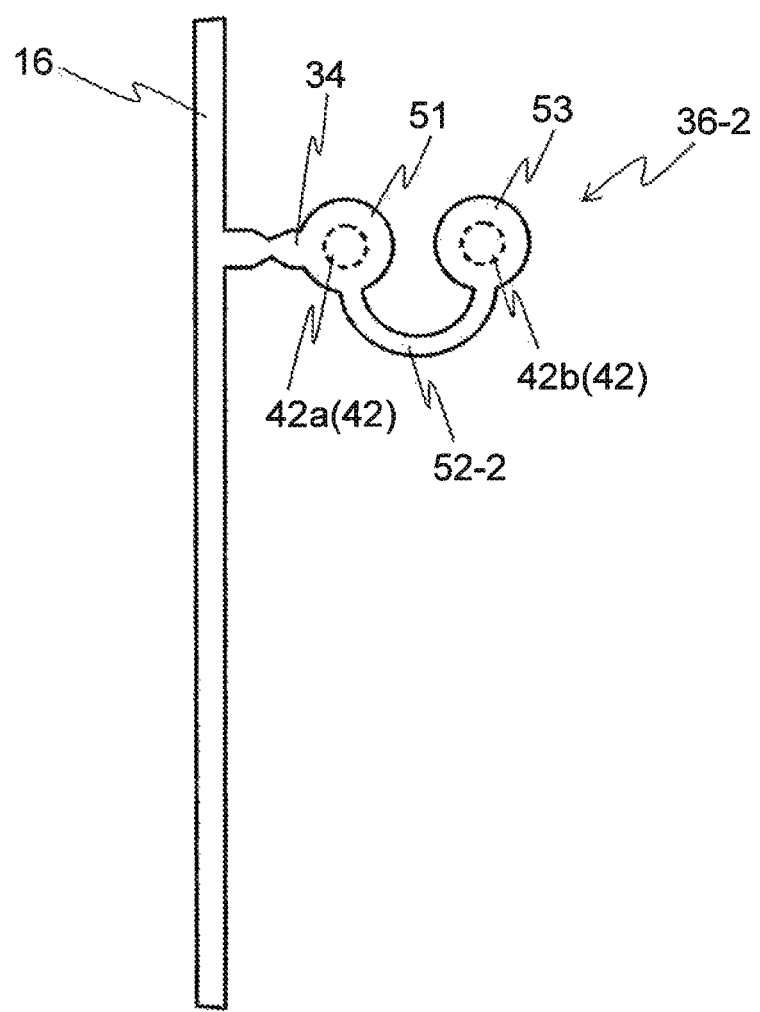
FIG. 7 is a plan view schematically showing another example of a probe and fixing tab by the method of the first embodiment.

FIG. 7 is a plan view schematically showing another example of a probe and fixing tab manufactured on a baseboard by the method for manufacturing a probe of the first embodiment.

In the example shown in FIG. 7, only the configuration of the second connecting portion 52-2 differs from the example shown in FIGS. 6A and 6B. Accordingly, identical reference characters indicate the other identical elements, and repeated descriptions are omitted. Further, in the example shown in FIG. 8, described later, repeated descriptions are omitted.

In the example shown in FIG. 7, a fixing tab 36-2, which is formed on a baseboard (not shown) and is connected to a probe 16, is composed of a first support plate 51 connected to a first connecting portion 34, second support plate 53, and second connecting portion 52-2 connecting therebetween. A sacrificial layer portion 42a is formed under the first support plate 51 as a first support portion, and a sacrificial layer portion 42b is formed under the second support plate 53 as a second support portion.

The second connecting portion 52-2 of the fixing tab 36-2 is formed in a curved line pattern. By arranging the second connecting portion 52-2 of the fixing tab 36-2 to have such a structure, if stresses are applied to the sacrificial layer portions 42a, 42b supporting the fixing tab 36-2, the stresses can be effectively dispersed to the second connecting portion 52-2 connecting therebetween.

Figure 8:
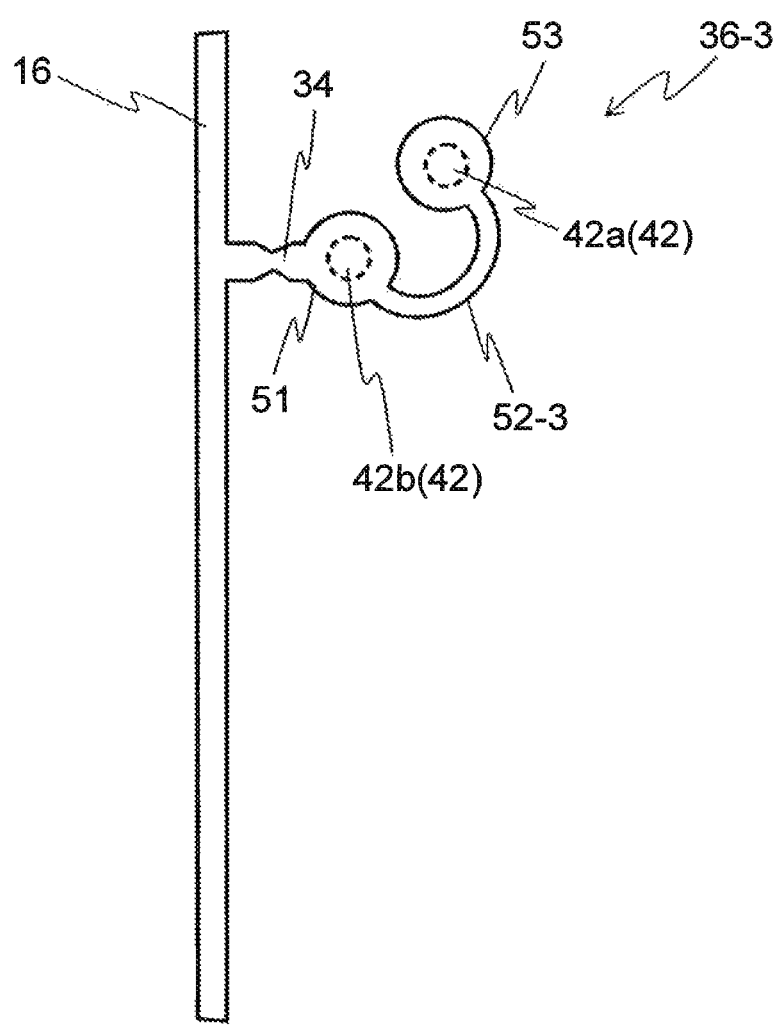
FIG. 8 is a plan view schematically showing a further example of a probe and fixing tab by the method for manufacturing a probe of the first embodiment of the invention.

FIG. 8 is a plan view schematically showing a further example of a probe and fixing tab manufactured on a baseboard by the method for manufacturing a probe of the first embodiment of the invention.

In the example shown in FIG. 8, a fixing tab 36-3, which is formed on a baseboard (not shown) and is connected to a probe 16, is composed of a first support plate 51 connected to a first connecting portion 34, second support plate 53, and second connecting portion 52-3 connecting therebetween. A sacrificial layer portion 42a is formed under the first support plate 51 as a first support portion, and a sacrificial layer portion 42b is formed under the second support plate 53 as a second support portion.

The second connecting portion 52-3 of the fixing tab 36-3 is formed in a curved line pattern. The placement position of the second support plate 53 differs from the example of FIGS. 6A and 6B and also from the example of FIG. 7. That is, the second support plate 53 is disposed such that the middle portion thereof deviates from the straight line passing through the first connecting portion 34 and the middle portion of the first support plate 51. In the example shown in FIG. 8, the second support plate 53 is provided so as to deviate upward from the straight line described above, and the second support plate 53 and first support plate 51 are connected by the curved second connecting portion 52-3.

By arranging the second connecting portion 52-3 of the fixing tab 36-3 to have such a curved structure, and also by disposing the second support plate 53 as described above, if stresses are applied to the sacrificial layer portions 42a, 42b supporting the fixing tab 36-3, the stresses can be effectively dispersed to the second connecting portion 52-3 connecting therebetween. In addition, since the formation area of the fixing tab 36-3 on a baseboard 32 can be decreased, many more probes 16 can be formed on the baseboard 32.

Second Embodiment

The method for manufacturing a probe of the second embodiment of the present invention provides a configuration such that a probe on a baseboard and fixing tab connected to the probe, which are manufactured in an intermediate stage, are fixed on the baseboard through three-point support of the fixing tab arranged by three support portions.

The method for manufacturing a probe of this second embodiment is similar to the method for manufacturing a probe of the first embodiment, except that the probe on the baseboard and the fixing tab connected to the probe manufactured in an intermediate stage are supported at three points (as described above). That is, the method for manufacturing a probe of this second embodiment comprises the same five steps as the method for manufacturing a probe of the first embodiment described above. However, after the fourth step, the probe on the baseboard and the fixing tab connected to the probe are disposed to the baseboard through three-point support of the fixing tab arranged by three support portions.

In the first step, the recess of a resist matching the plane pattern of the fixing tab is formed so as to match the three-point support of the fixing tab through the same manner as described above. As a result, in the second step, the pattern of the probe and fixing tab connected to the probe becomes the pattern corresponding to the three-point support according to the same manner as described above. In the fourth step, the structure is formed in which the probe on the baseboard and the fixing tab connected to the probe are disposed on the baseboard through three-point support of the fixing tab arranged by three support portions, through the same manner as described above.

Accordingly, in the following description of the method for manufacturing a probe of this second embodiment, an explanation of the pattern of the probe on the baseboard and the fixing tab connected to the probe manufactured in an intermediate stage will be given. Then, the elements common to the method for manufacturing a probe of the first embodiment are indicated by identical reference characters, and repeated descriptions are omitted.

The method for manufacturing a probe of the second embodiment of the present invention enables manufacture of, for example, probes 16 having the above configuration shown in FIG. 3 at a high yield, similar to the first embodiment.

Figure 9:
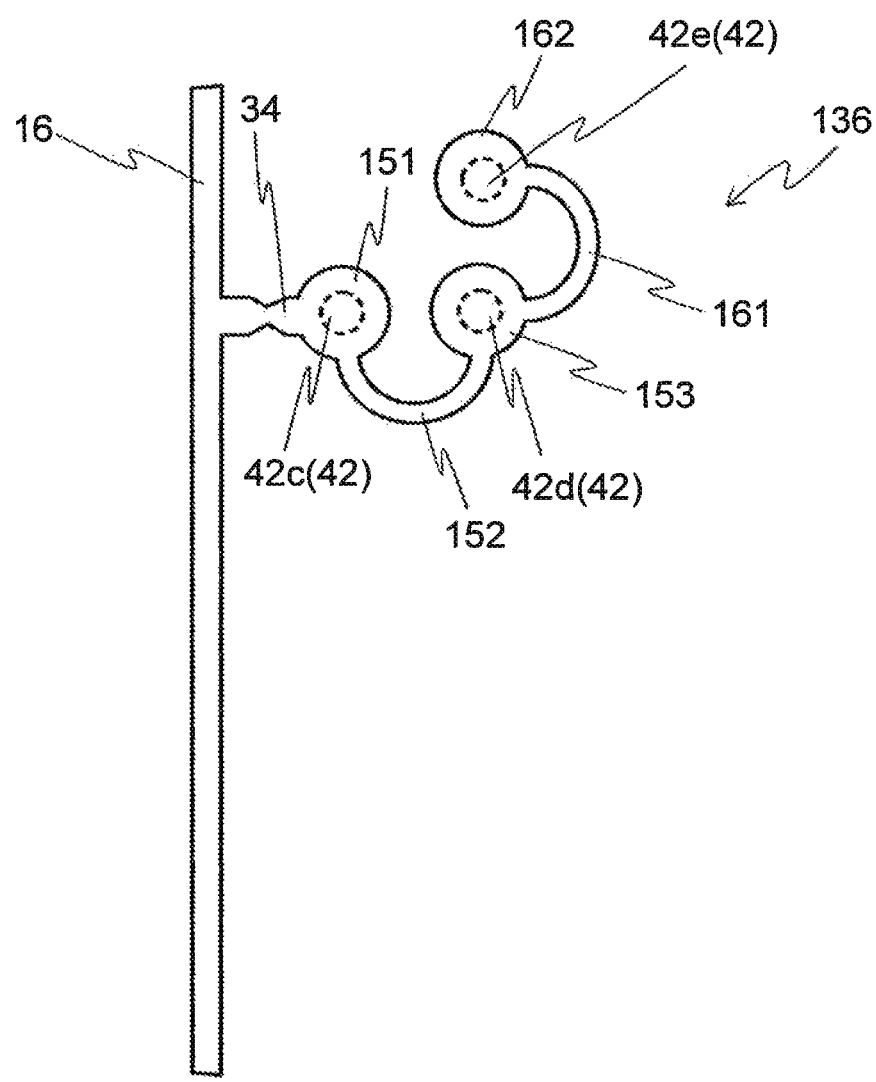
FIG. 9 is a plan view schematically showing the first example of a probe and fixing tab by the method for manufacturing a probe of the second embodiment of the invention.

FIG. 9 is a plan view schematically showing the first example of a probe and fixing tab manufactured on a baseboard by the method for manufacturing a probe of the second embodiment of the invention.

The probe 16 and fixing tab 136 formed on a baseboard (not shown) presented as the first example in FIG. 9 is formed through an etching process in the fourth step after the similar first to third steps as those of the method for manufacturing a probe of the first embodiment. In FIG. 9, the pattern of the probe 16 is schematically illustrated.

As shown in FIG. 9, the fixing tab 136 is constructed of a first support plate 151 connected to the probe 16 via a first connecting portion 34, a second support plate 153 connected to the first support plate 151 via a second connecting portion 152, and a third support plate 162 connected to the second support plate 153 via a third connecting portion 161. That is, the fixing tab 136 is constructed of the first support plate 151, second support plate 153, third support plate 162, second connecting portion 152 connecting between the first support plate 151 and the second support plate 153, and third connecting portion 161 connecting the second support plate 153 and the third support plate 162. This fixing tab 136 is configured so as to be coupled to the side of the body 22 of the probe 16 shown in FIG. 3, opposite to the side on which the arm section 24 is formed, via the first connecting portion 34.

Under the first support plate 151, second support plate 153 and third support plate 162, there are formed a sacrificial layer portions 42c, 42d, 42e, respectively, which are portions of a sacrificial layer 42 and constitute three support portions. That is, the sacrificial layer portion 42c is formed as the first support portion under the first support plate 151, the sacrificial layer portion 42d is formed as the second support portion under the second support plate 153, and the sacrificial layer portion 42e is formed as the third support portion under the third support plate 162.

As a result, the structure is formed in which the probe 16 on the baseboard and the fixing tab 136 connected to the probe 16 are disposed on the baseboard through three-point support of the fixing tab 136 arranged by three support portions, by forming those sacrificial layer portions 42c, 42d, 42e under the first support plate 151, second support plate 153 and third support plate 162, respectively.

The second connecting portion 152 of the fixing tab 136 is formed in a curved line pattern, and the third connecting portion 161 is also formed in a curved line pattern.

The third support plate 162 is disposed such that the middle portion thereof deviates from the straight line passing through the first connecting portion 34, the middle portion of the first support plate 151 and the middle portion of the second support plate 153. In the example shown in FIG. 9, the third support plate 162 is provided so as to deviate upward from the straight line described above.

By arranging the second connecting portion 152 and third connecting portion 161 of the fixing tab 136 to have such a curved structure, and also by disposing the third support plate 162 as described above, if stresses are applied to the sacrificial layer portions 42c, 42d, 42e supporting the fixing tab 136, the stresses can be effectively dispersed to the second connecting portion 152 and third connecting portion 161 connecting therebetween. As a result, the method for manufacturing a probe of the second embodiment of the present invention enables prevention of the probe 16 from dropping from the baseboard 32 and enables manufacture of the probes 16 at a high manufacture yield. In addition, since the formation area of the fixing tab 136 on a baseboard can be decreased, many more probes 16 can be formed on the baseboard.

The pattern of the third connecting portion 161 of the fixing tab 136 connected to the probe 16, which is formed in an intermediate stage of the method for manufacturing a probe of this second embodiment may be formed in a straight line.

Figure 10:
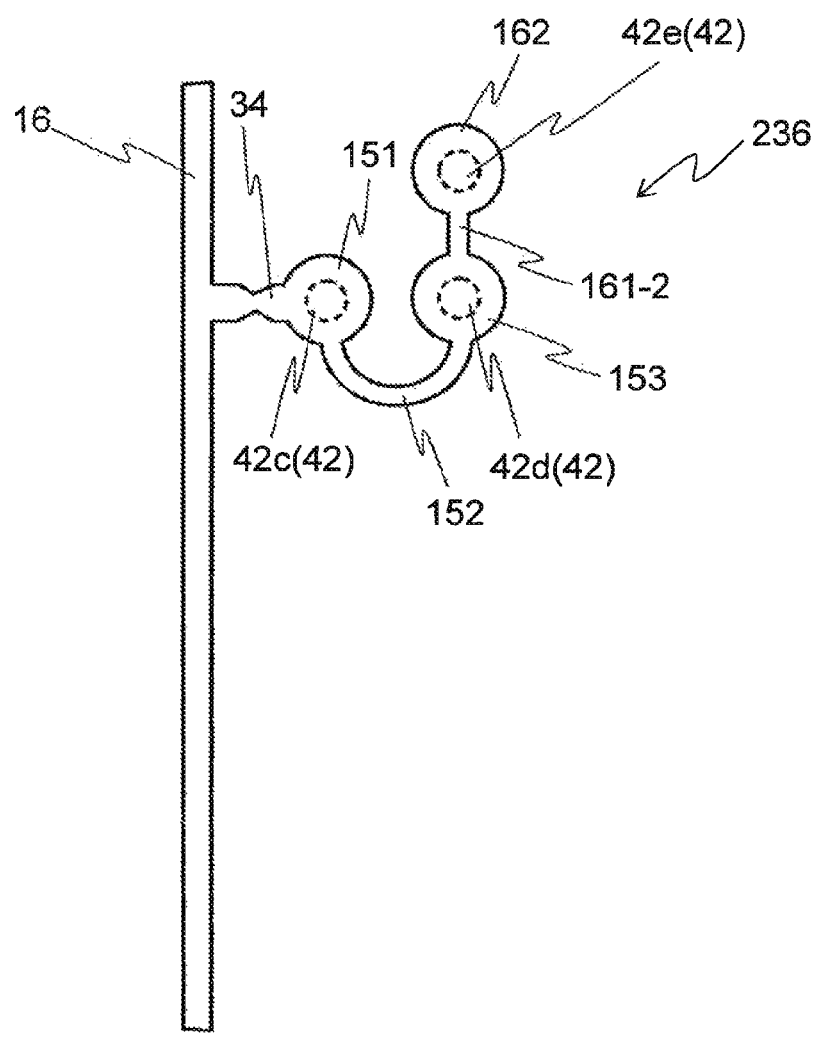
FIG. 10 is a plan view schematically showing the second example of a probe and fixing tab by the method for manufacturing a probe of the second embodiment of the invention.

FIG. 10 is a plan view schematically showing the second example of a probe and fixing tab manufactured on a baseboard by the method for manufacturing a probe of the second embodiment of the invention.

The probe 16 and fixing tab 236 formed on a baseboard (not shown) shown in FIG. 10 as the second example has the same configuration as that of the first example of FIG. 9, except that the third connecting portion 161-2 is configured in a straight line pattern. Accordingly, identical elements are indicated by identical reference characters, and repeated descriptions are omitted.

Likewise, the probe 16 and fixing tab 336 formed on a baseboard (not shown) shown in FIG. 11 as the third example, and the probe 16 and fixing tab 436 formed on a baseboard (not shown) shown in FIG. 12 of the fourth example (to be described later) are also configured in the same manner as the first example of FIG. 9, except that the configuration of the respective fixing tabs 336, 436 are different. Identical elements are therefore indicated by identical reference characters, and repeated descriptions are omitted.

The second connecting portion 152 of the fixing tab 236 is formed in a curved line pattern, while the third connecting portion 161-2 is formed in a straight line pattern.

The third support plate 162 is disposed such that the middle portion thereof deviates from the straight line passing through the first connecting portion 34, the middle portion of the first support plate 151 and the middle portion of the second support plate 153. In the example shown in FIG. 10, the third support plate 162 is provided so as to deviate upward from the straight line described above.

By arranging the second connecting portion 152 of the fixing tab 136 and the third connecting portion 161-2 to have the structure described above, and also by disposing the third support plate 162 as described above, if stresses are applied to the sacrificial layer portions 42c, 42d, 42e supporting the fixing tab 136, the stresses can be effectively dispersed to the second connecting portion 152 and third connecting portion 161-2 connecting therebetween. Moreover, since the formation area of the fixing tab 136 on a baseboard can be decreased, many more probes 16 can be formed on the baseboard.

In regard to the probe and fixing tab manufactured on a baseboard in an intermediate stage of the method for manufacturing a probe of this second embodiment, the fixing tab may be constructed in a different configuration. That is, the probe and fixing tab manufactured on a baseboard in an intermediate stage of the method for manufacturing a probe of this second embodiment may be provided with a plurality of supports by leaving plural sacrificial layer portions apart from each other under the respective support plates constituting the fixing tab.

For example, it is possible to construct the fixing tab from two pieces of support plates, the first support plate and second support plate, and two sacrificial layer portions apart from each other are left under one of the two support plates, while one sacrificial layer portion is left under the other support plate. Such a construction is thereby provided in which the probe and fixing tab are disposed on a baseboard through three-point support of the fixing tab arranged by three support portions, having the three sacrificial layer portions under the first and second support plates as the supports.

Figure 11:
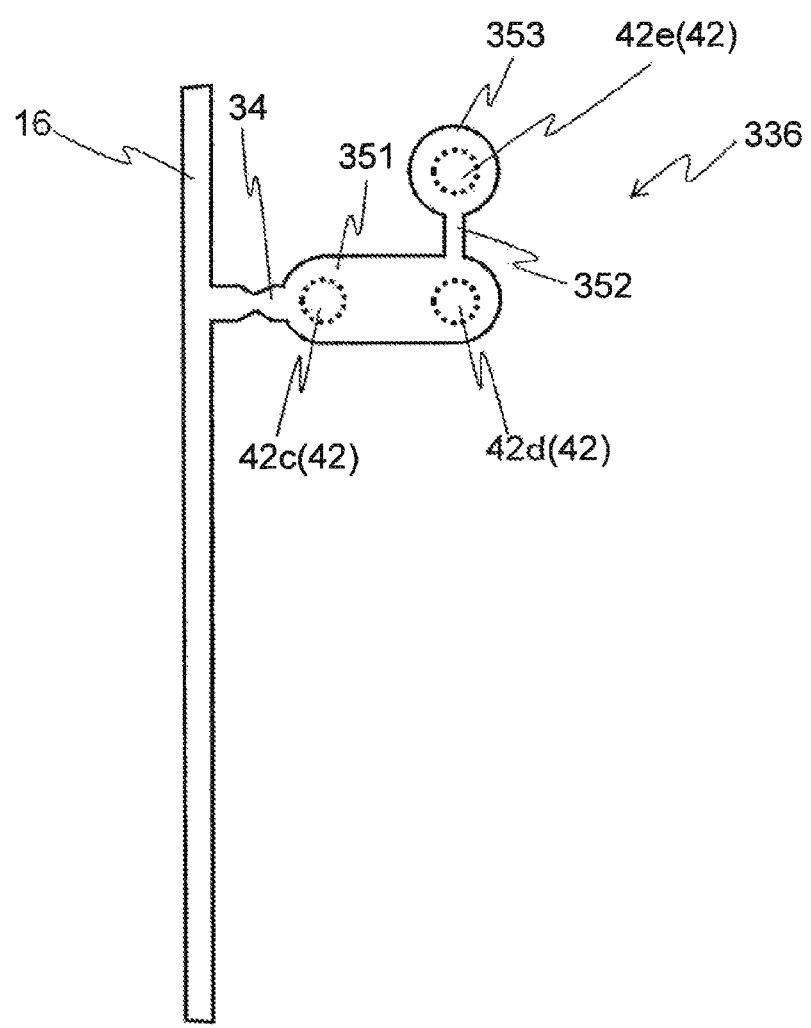
FIG. 11 is a plan view schematically showing the third example of a probe and fixing tab by the method for manufacturing a probe of the second embodiment of the invention.

FIG. 11 is a plan view schematically showing the third example of a probe and fixing tab manufactured on a baseboard by the method for manufacturing a probe of the second embodiment of the invention.

The probe 16 and fixing tab 336 formed on a baseboard (not shown) presented as the third example in FIG. 11 is formed through an etching process in the fourth step after the similar first, second, and third steps, as those of the method for manufacturing a probe of the first embodiment. In FIG. 11, the pattern of the probe 16 is schematically illustrated.

As shown in FIG. 11, the fixing tab 336 is constructed of a first support plate 351 connected to the probe 16 via a first connecting portion 34, and a second support plate 353 connected to the first support plate 351 via a second connecting portion 352. That is, the fixing tab 336 is constructed of the first support plate 351, second support plate 353, and second connecting portion 352 connecting between the first support plate 351 and the second support plate 353. This fixing tab 336 is configured so as to be coupled to the side of the body 22 of the probe 16 shown in FIG. 3, opposite to the side on which the arm section 24 is formed, via the first connecting portion 34.

The first support plate 351 has an oval shape and the second support plate 353 has a circular shape.

Under the first support plate 351, there are formed two sacrificial layer portions 42c, 42d, being portions of a sacrificial layer 42, positioned apart from each other in the longitudinal direction of the first support plate 351 as the first support portion and second support portion. Under the second support plate 353, there is formed a sacrificial layer portion 42e, being a portion of a sacrificial layer 42, as the third support portion. That is, the three sacrificial layer portions 42c, 42d, 42e apart from each other under the first support plate 351 and second support plate 353 constitute three support portions supporting the fixing tab 336 on the baseboard.

As a result, the structure is formed in which the probe 16 on the baseboard and the fixing tab 336 connected to the probe 16 are disposed on the baseboard through three-point support of the fixing tab 336 arranged by three support portions, by forming those sacrificial layer portions 42c, 42d, 42e apart from each other under the first support plate 351 and second support plate 353.

The second connecting portion 352 of the fixing tab 336 is formed in a straight line pattern.

The second support plate 353 is disposed such that the longitudinal direction of the first support plate 351 having an oval shape and the second connecting portion 352 intersect each other. In the example of FIG. 11, the second support plate 353 is provided on the upper side of the first support plate 351. As a result, in the example illustrated in FIG. 11, the straight line passing through the middle portion of the sacrificial layer portion 42c and the middle portion of the sacrificial layer portion 42d intersects at right angles with the straight line passing through the middle portion of the sacrificial layer portion 42d and the middle portion of the sacrificial layer portion 42e.

By arranging the first support plate 351, second support plate 353 and second connecting portion 352 of the fixing tab 336 to have the structure described above, if stresses are applied to the sacrificial layer portions 42c, 42d, 42e supporting the fixing tab 336, the stresses can be effectively dispersed to a portion of the first support plate 351 and the second connecting portion 352 connecting therebetween. As a result, the method for manufacturing a probe of the second embodiment of the present invention prevents the probe 16 from dropping off from the baseboard and enables manufacture of probes at a high yield. Moreover, since the formation area of the fixing tab 336 on a baseboard can be decreased, many more probes 16 can be formed on the baseboard.

Figure 12:
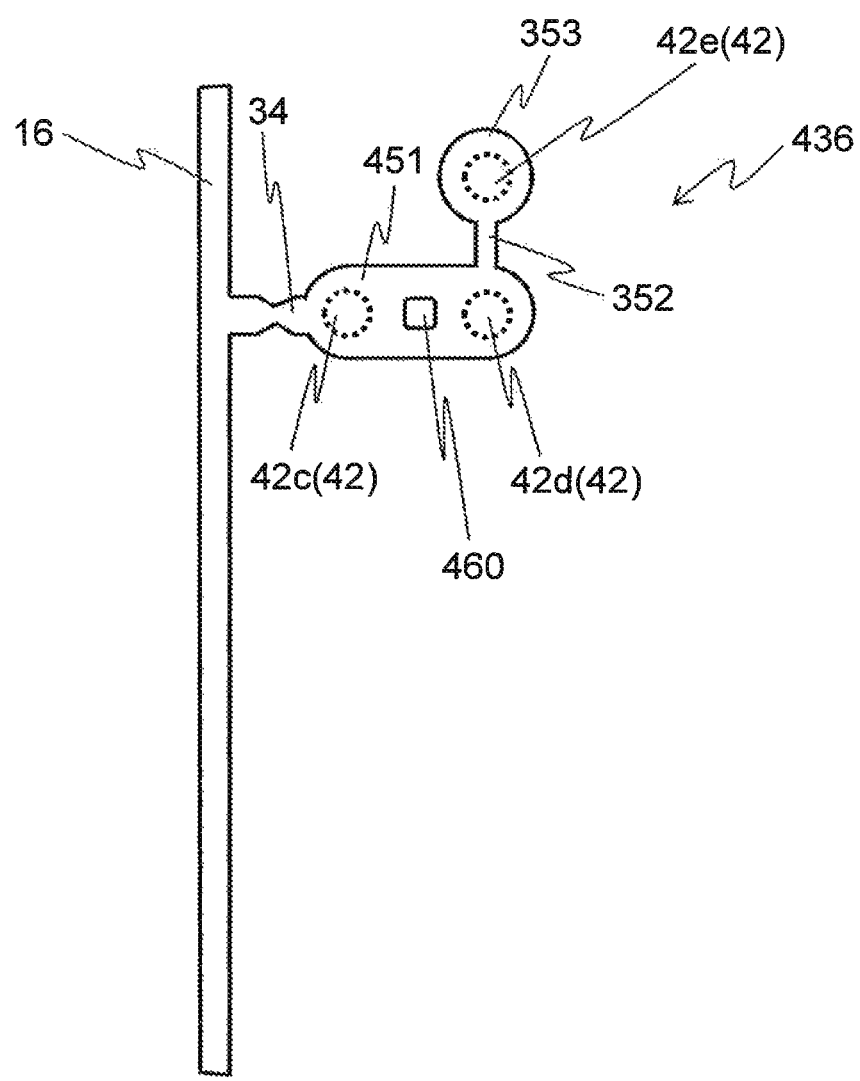
FIG. 12 is a plan view schematically showing the fourth example of a probe and fixing tab by the method for manufacturing a probe of the second embodiment of the invention.

FIG. 12 is a plan view schematically showing the fourth example of a probe and fixing tab manufactured on a baseboard by the method for manufacturing a probe of the second embodiment of the invention.

The probe 16 and fixing tab 436 formed on a baseboard (not shown) presented as the fourth example in FIG. 12 is formed through an etching process in the fourth step after the similar first, second, and third steps as those of the method for manufacturing a probe of the first embodiment. In FIG. 12, the pattern of the probe 16 is schematically illustrated.

As shown in FIG. 12, the fixing tab 436 is constructed of a first support plate 451 connected to the probe 16 via a first connecting portion 34, and a second support plate 353 connected to the first support plate 451 via a second connecting portion 352. That is, the fixing tab 436 is constructed of the first support plate 451, second support plate 353, and second connecting portion 352 connecting between the first support plate 451 and the second support plate 353. This fixing tab 436 is configured so as to be coupled to the side of the body 22 of the probe 16 shown in FIG. 3, opposite to the side on which the arm section 24 is formed, via the first connecting portion 34.

The first support plate 451 has an oval shape similar to the first support plate 351 of the third example in FIG. 3 and further has an opening 460 in the middle portion thereof between the formation portion of a sacrificial layer portion 42c and the formation portion of a sacrificial layer portion 42d. By being provided with the opening 460, the formation of the sacrificial layer portions 42c, 42d can be more easily performed in the etching process in the fourth step of the method for manufacturing a probe of the second embodiment.

The fixing tab 436 has the same configuration as the fixing tab 336 of the third example in FIG. 11, except that the opening 460 is provided in the first support plate 451.

By arranging the first support plate 451 of the fixing tab 436 to have the structure provided with the opening 460, it becomes possible to more easily perform the formation of the sacrificial layer portions 42c, 42d each having a desired shape in the fourth step. In addition, if stresses are applied to the sacrificial layer portions 42c, 42d, 42e supporting the fixing tab 436, the stresses can be effectively dispersed to a portion of the first support plate 451 and the second connecting portion 352 connecting therebetween. Moreover, since the formation area of the fixing tab 436 on a baseboard can be decreased, many more probes 16 can be formed on the baseboard.

Third Embodiment

In the method for manufacturing a probe of the first embodiment of the present invention, the fixing tab of a probe manufactured in an intermediate process is constructed to be coupled to the side of the body of the probe. And, the probe and fixing tab connected thereto are configured so as to be fixed to a baseboard through the fixing tab arranged by two support portions.

Conversely, in the method for manufacturing a probe of the third embodiment of the present invention, a fixing tab of a probe manufactured on a baseboard in an intermediate process is constructed to be disposed in an opening provided in the arm section of the probe to be coupled to the probe. The probe and fixing tab are fixed to the baseboard through the fixing tab provided by plural support portions.

The method for manufacturing a probe of the third embodiment of the present invention is the same as the method for manufacturing a probe of the first embodiment, except that the probe and fixing tab connected to the probe on a baseboard manufactured in an intermediate step have the structure described above. That is, the method for manufacturing a probe of this third embodiment includes the same first to fifth steps as the method for manufacturing a probe of the first embodiment. After the fourth step, the probe and fixing tab connected thereto on the baseboard are manufactured in a state of being fixed on the baseboard through the fixing tab provided by plural support portions.

In the first step, in the same manner as described above, the portion of the recess of the resist corresponding to the plane pattern of the fixing tab is formed to correspond to the configuration in which the fixing tab is disposed in the opening provided in the arm section of the probe. As a result, in the second step, the pattern of the probe and fixing tab connected thereto corresponds to the configuration described above. Then, in the fourth step, the structure is formed in which the probe on the baseboard and the fixing tab, which is disposed in the opening of the arm section of the probe and is connected to the probe, are fixed on the baseboard through the fixing tab arranged by two support portions.

Accordingly, in the following description of the method for manufacturing a probe of this third embodiment, an explanation about the pattern of the probe and fixing tab connected thereto on the baseboard manufactured in an intermediate step will be given. As the elements common to the method for manufacturing a probe of the first embodiment are indicated by identical reference characters, repeated descriptions are omitted.

The method for manufacturing a probe of the third embodiment of the present invention enables manufacture of, for example, probes 16 having the above configuration shown in FIG. 3 at a high yield as in the first embodiment.

Figure 13:
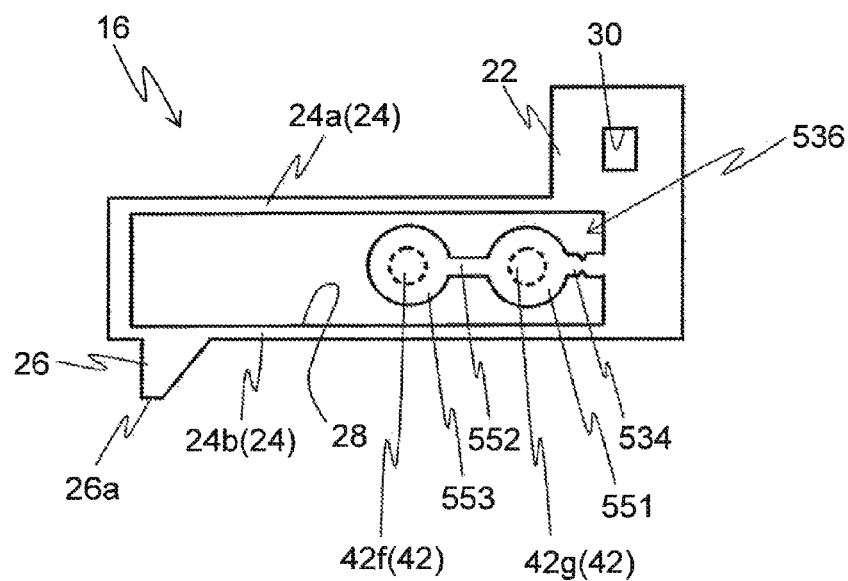
FIG. 13 is a plan view schematically showing the first example of a probe and fixing tab by the method for manufacturing a probe of the third embodiment of the invention.

FIG. 13 is a plan view schematically showing the first example of a probe and fixing tab manufactured on a baseboard by the method for manufacturing a probe of the third embodiment of the invention.

In FIG. 13, the fixing tab 536 and the like are schematically illustrated in order to clarify the features, for example, the size ratio of the fixing tab 536 with respect to the probe 16 is not limited to one illustrated in FIG. 13, but is able to be altered as appropriate.

The probe 16 and fixing tab 536 formed on a baseboard (not shown) exemplified in FIG. 13 is formed through an etching process in the fourth step after the similar first, second, and third steps as those of the method for manufacturing a probe of the first embodiment. Then, the probe 16 and fixing tab 536 are separated in the fifth step, and the same probe 16 as illustrated in FIG. 3 can be obtained.

The probe 16, which is flat shaped as a whole, comprises a body 22 provided with an opening 30, an arm section 24 extending laterally from the lower end of the body 22, and a probe tip section 26 extending longitudinally, i.e., downwardly from the tip of the arm section 24, and has a contact end 26a formed at the end of the probe tip section 26, as shown in FIG. 3.

The arm section 24 has an opening 28 provided in the thickness direction of the probe 16 between the body 22 and the probe tip section 26, and extending in the longitudinal direction of the arm section 24. Due to the opening 28, the arm section 24 is partitioned into a pair of arm portions 24a, 24b apart from each other in parallel. One end of the opening 28 reaches the body 22.

In the first example shown in FIG. 13, the fixing tab 536 is constructed to be disposed in the opening 28 of the arm section 24 of the probe 16 and to be coupled to the body 22 of the probe 16 on the side where the opening 28 is formed.

As shown in FIG. 13, the fixing tab 536 is constructed of a first support plate 551 connected to the probe 16 via a first connecting portion 534, and a second support plate 553 connected to the first support plate 551 via a second connecting portion 552. That is, the fixing tab 536 is constructed of the first support plate 551, second support plate 553, and second connecting portion 552 connecting between the first support plate 551 and the second support plate 553.

There are formed sacrificial layer portions 42f, 42g, being portions of a sacrificial layer 42, under the first support plate 551 and second support plate 553 of the fixing tab 536, respectively, and they constitute two support portions. That is, the sacrificial layer portion 42g is formed as the first support portion under the first support plate 551, and the sacrificial layer portion 42f is formed as the second support portion under the second support plate 553.

The structure of the above fixing tab 536 on a baseboard is similar as that of the fixing tab 36 of FIGS. 6A and 6B manufactured in an intermediate stage of the method for manufacturing a probe of the first embodiment.

As a result, the structure is formed in which the probe 16 on the baseboard and the fixing tab 536 connected to the probe 16 are disposed on the baseboard through the fixing tab 536 arranged by two support portions, by forming those sacrificial layer portions 42g, 42f under the first support plate 551 and second support plate 553, respectively.

By constructing the fixing tab 536 from the first support plate 551 and second support plate 553 which are connected by the second connecting portion 552 to each other, if stresses are applied to the sacrificial layer portion 42g supporting the first support plate of the fixing tab 536 and the sacrificial layer portion 42f supporting the second support plate, the stresses can be dispersed to the second connecting portion 552 connecting therebetween. As a result, the method for manufacturing a probe of the third embodiment of the present invention enables prevention of the probe 16 from dropping from the baseboard and manufacture of the probes 16 at a high manufacture yield.

Moreover, in the method for manufacturing a probe of this third embodiment, by disposing the fixing tab 536, being formed on the baseboard, in the opening 28 of the arm section 24 of the probe 16, the formation area of the probe 16 and fixing tab 536 on the baseboard can be decreased, and many more probes 16 can therefore be formed on the baseboard.

In the method for manufacturing a probe of this third embodiment, after the probe 16 and fixing tab 536 on the baseboard shown in FIG. 13 have been manufactured in the fourth step, the probe 16 can be removed from the baseboard in the same manner as the first and second embodiments described above. That is, in the method for manufacturing a probe of this third embodiment, after an etching process has been completed in the state in which the sacrificial layer portions 42g, 42f remain in the fourth step, the probe 16 is separated from the first support plate 551 of the fixing tab 536 and is taken off from the baseboard in the fifth step.

At this fifth step, the probe 16 can be taken off from the baseboard without applying a strong peeling force (as previously required) to the probe 16. The removal of the probe 16 from the fixing tab 536 is done in a manner that the probe 16 is held using a tool such as, for example, tweezers, spatula, knife or the like from below, and is raised upward with the tool, in the same manner as the first and second embodiments described above. The narrowest width portion of the first connecting portion 534 can be thereby broken. Incidentally, in the case in which the metal material composing the probe 16 is a magnetic substance, it is possible to use a magnet for handling the probe 16.

In the method for manufacturing a probe of this third embodiment, although the probe 16 and fixing tab 536 manufactured on a baseboard in an intermediate step have a structure in which the fixing tab 536 is disposed in the opening 28 provided in the arm section 24 of the probe 16 and is coupled to the probe 16, as described above, the structure of the fixing tab 536 is not limited to one shown in FIG. 13. The fixing tab 536 is able to have various configurations as long as disposed in the opening 28 provided in the arm section 24 of the probe 16, and forming the structure of two-point support by means of the sacrificial layer portions 42f, 42g.

Another example of the structure of the probe and fixing tab manufactured on a baseboard in an intermediate process of the method for manufacturing a probe of this third embodiment will be specifically described below.

Figure 14:
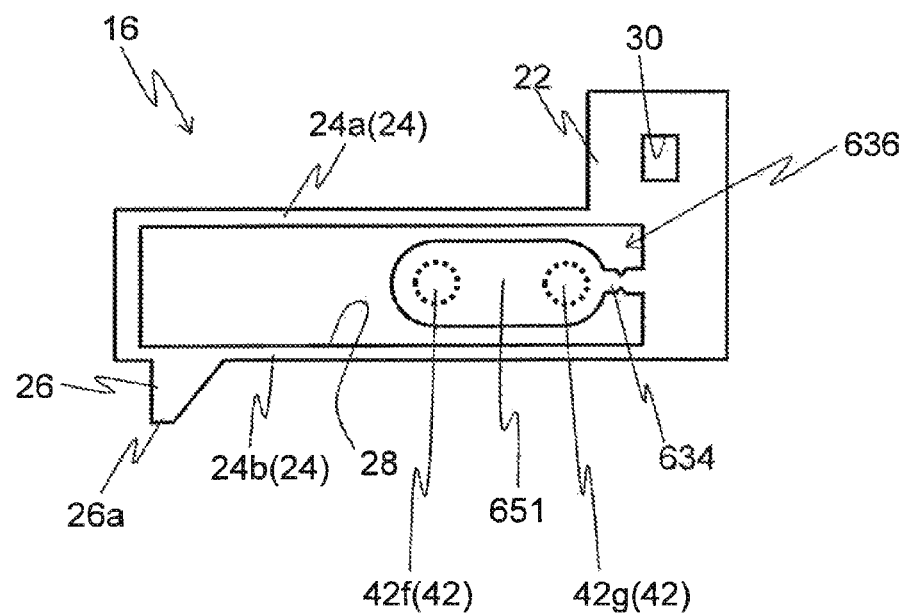
FIG. 14 is a plan view schematically showing the second example of a probe and fixing tab by the method for manufacturing a probe of the third embodiment of the invention.

FIG. 14 is a plan view schematically showing the second example of a probe and fixing tab manufactured on a baseboard by the method for manufacturing a probe of the third embodiment of the invention.

In the second example shown in FIG. 14, only the configuration of the fixing tab 636 differs from the first example shown in FIG. 13; accordingly, same element numbers indicate the other common elements, and repeated descriptions are omitted. The same omissions are made for the third example shown in FIG. 15, described later.

The fixing tab 636 formed on a baseboard is constructed to be disposed in an opening 28 provided in the arm section 24 of the probe 16 and to be coupled to the body 22 of the probe 16 on the side where the opening 28 is formed.

As shown in FIG. 14, the fixing tab 636 comprises a first support plate 651 connected to the probe 16 via a first connecting portion 634. The first support plate 651 has an oval shape.

Under the first support plate 651, there are formed two sacrificial layer portions 42f, 42g, being portions of a sacrificial layer 42, apart from each other in the longitudinal direction of the first support plate 651 as the first support portion and second support portion. That is, the two sacrificial layer portions 42f, 42g under the first support plate 651 constitute two support portions supporting the fixing tab 636 on the baseboard.

As a result, the structure is formed in which the probe 16 on the baseboard and the fixing tab 636 connected to the probe 16 are disposed on the baseboard through two-point support of the fixing tab 636 by means of the sacrificial layer portions 42f, 42g under the first support plate 651.

By arranging the first support plate 651 of the fixing tab 636 to have the above structure, if stresses are applied to the sacrificial layer portions 42f, 42g supporting the fixing tab 636, the stresses can be effectively dispersed to the first support plate 651 connecting therebetween. As a result, the method for manufacturing a probe of the third embodiment of the present invention enables prevention of the probe 16 from dropping from the baseboard and manufacture of the probes 16 at a high manufacture yield.

Moreover, in the method for manufacturing a probe of this third embodiment, by disposing the fixing tab 636, being formed on the baseboard, in the opening 28 provided in the arm section 24 of the probe 16, the formation area of the probe 16 and fixing tab 636 on the baseboard can be decreased, and many more probes 16 can therefore be formed on the baseboard.

Also in regard to the probe 16 and fixing tab 636 on the baseboard in FIG. 14, the probe 16 can be taken off from the baseboard in the same manner as the first example of FIG. 13.

Figure 15:
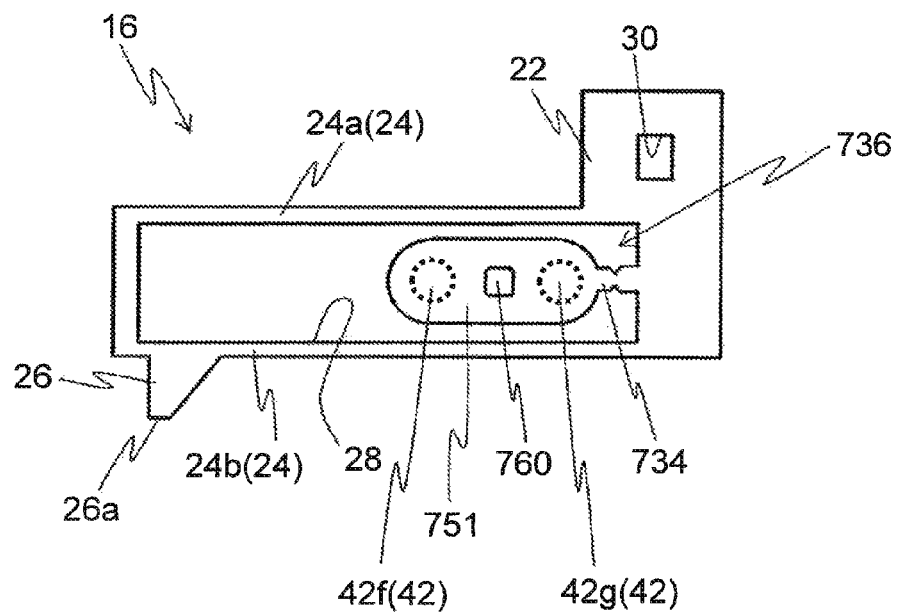
FIG. 15 is a plan view schematically showing the third example of a probe and fixing tab by the method for manufacturing a probe of the third embodiment of the invention.

FIG. 15 is a plan view schematically showing the third example of a probe and fixing tab manufactured on a baseboard by the method for manufacturing a probe of the third embodiment of the invention.

The fixing tab 736 formed on a baseboard is constructed to be disposed in an opening 28 provided in the arm section 24 of the probe 16 and to be coupled to the body 22 of the probe 16 on the side where the opening 28 is formed.

As shown in FIG. 15, the fixing tab 736 comprises a first support plate 751 connected to the probe 16 via a first connecting portion 734. The first support plate 751 has an oval shape similar to the first support plate 651 of the second example in FIG. 14. Further, the first support plate 751 has an opening 760 in the middle portion between portions where a sacrificial layer portion 42f, being one portion of a sacrificial layer 42, and a sacrificial layer portion 42g, being another portion of the sacrificial layer 42, are formed, respectively. By providing the opening 760, the formation of the sacrificial layer portions 42f, 42g can be more easily formed in the etching process in the fourth step of the method for manufacturing a probe of the third embodiment.

The fixing tab 736 has the same configuration as the fixing tab 636 of the second example in FIG. 14, except that the opening 760 is provided in the first support plate 751.

By arranging the first support plate 751 of the fixing tab 736 to have the structure provided with the opening 760, it becomes possible to easily form the sacrificial layer portions 42f, 42g each having a desired shape in the etching process in the fourth step.

If stresses are applied to the sacrificial layer portions 42f, 42g supporting the fixing tab 736, the stresses can be effectively dispersed to a portion of the first support plate 751 connecting therebetween. As a result, the method for manufacturing a probe of the third embodiment of the present invention prevents the probe 16 from dropping off from the baseboard and enables manufacture of probes at a high yield.

Moreover, in the method for manufacturing a probe of this third embodiment, by disposing the fixing tab 736, being formed on the baseboard, in the opening 28 provided in the arm section 24 of the probe 16, the formation area of the probe 16 and fixing tab 736 on the baseboard can be decreased, and many more probes 16 can therefore be formed on the baseboard.

Further, in regard to the probe 16 and fixing tab 736 on the baseboard in FIG. 15, the probe 16 can be taken off from the baseboard in the same manner as the first example of FIG. 13.

Embodiments of the present invention will be specifically described below using examples. The present invention is however not limited to these examples.

In the examples of the invention, probes were manufactured according to the method for manufacturing a probe of the first embodiment of the invention described above.

The probe and fixing tab on a baseboard manufactured in an intermediate stage of the manufacture process are illustrated in FIG. 3, FIGS. 6A and 6B.

First, a silicon crystal substrate, which is mirror finished through an etching process, is prepared as a baseboard.

On the prepared baseboard, a sacrificial layer composed of copper is formed by means of a sputtering method.

Next, on the sacrificial layer, a photosensitive resist layer is formed by coating a photoresist material, composed of a photosensitive material, in a uniform thickness by means of a spin coat method. This resist layer is subjected to selective exposure by use of a mask and is then developed. The mask has a pattern corresponding to the whole plane pattern including a probe, fixing tab, and first connecting portion connecting between the probe and the fixing tab. By transcribing the mask pattern, on the baseboard, a resist is formed that is provided with a recess having a plane pattern corresponding to the whole plane pattern including the probe, first connecting portion and fixing tab.

Then, in the recess of the resist, a probe material composed of nickel is deposited by means of electroforming (electroplating), and the probe, first connecting portion and fixing tab were formed on the sacrificial layer in the recess.

After that, the resist is removed and a wet etching process of the sacrificial layer is performed. Through this etching process, the sacrificial layer is removed except one portion thereof, and the probe and fixing tab supported by the remaining portion of the sacrificial layer on the baseboard were formed. The probe and fixing tab on the baseboard have the configuration illustrated in FIGS. 6A and 6B. That is, the probe is constructed so as to be supported by a sacrificial layer portion, being the first support under the first support plate of the fixing tab, and another sacrificial layer portion, being the second support under the second support plate, on the baseboard.

Then, when the probe is held and lifted up using tweezers, the probe is broken in the first connecting portion.

In the example of manufacturing the probe described above, the probe drop rate from the baseboard during manufacture is 2.1%.

Next, a probe is manufactured according to a manner similar to the above example, except that the probe and fixing tab manufactured in an intermediate stage of the manufacture-step are illustrated in FIG. 7. The probe drop rate from the baseboard during manufacture is 1.6%.

Further, a probe is manufactured according to a manner similar to the above example, except that the probe and fixing tab manufactured in an intermediate stage of the manufacture process are illustrated in FIG. 8. The probe drop rate from the baseboard during manufacture is 2.1%.

As a comparable example, a probe is manufactured according to a manner similar to the above example, except that the probe and fixing tab manufactured in an intermediate stage of the manufacture process is illustrated in FIGS. 1A and 1B. The pattern of the probe is designated to be similar to one illustrated in FIG. 3. As a result, the probe drop rate from the baseboard during manufacture became 4.5%, which is a larger value as compared with the above examples.

As described above, according to the embodiments, a method for manufacturing a probe that reduces the occurrence of dropping of probes from a baseboard is provided.

It should be noted that the present invention is not limited to the embodiments described above, and may be practiced in various other forms not departing from the spirit and scope of the invention.

According to the embodiments of the present invention, it is possible to manufacture probes at a high productivity and to manufacture electric connecting devices also at a high productivity. Accordingly, the electric connecting devices of the embodiments are particularly effective for inspection of semiconductor devices used for consumer-electronics products for which productivity improvements are strongly demanded.

What is claimed is:

1. A method for manufacturing a probe, comprising:
   forming a recess with a resist, on a sacrificial layer, wherein
      the recess has a plane pattern of the probe and a fixing tab connected to the probe,
      the recess exposes the sacrificial layer, and
      the sacrificial layer is located on a baseboard;
   forming the probe and the fixing tab connected to the probe by depositing a probe material in the recess;
   removing the resist;
   removing a portion of the sacrificial layer in an etching process, including fully removing the sacrificial layer between the baseboard and the probe, and leaving a remaining portion of the sacrificial layer between the baseboard and the fixing tab, the remaining portion including a plurality of support portions of the sacrificial layer between the baseboard and the fixing tab supporting the probe and the fixing tab on the baseboard; and
   removing the probe from the baseboard.

2. The method for manufacturing a probe according to claim 1, wherein
   the support portions supporting the fixing tab on the baseboard are spaced apart from each other, and each support portion has a shape selected from the group consisting of a circle, an ellipse, a polygon, and a star, in a cross section parallel to the plane of the baseboard; and
   in forming the recess, forming a portion of the recess matching the plane pattern of the fixing tab in the etching process so that each of the support portions has the shape, in the cross-section, that is selected.

3. The method for manufacturing a probe according to claim 1, wherein
   the support portions supporting the fixing tab on the baseboard are spaced apart from each other, and the support portions have cross sections, parallel to the plane of the baseboard, with identical areas; and
   in forming the recess, forming a portion of the recess matching the plane pattern of the fixing tab in the etching process so that the cross sections of the respective support portions have identical areas.

4. The method for manufacturing a probe according to claim 1, wherein
   the support portions supporting the fixing tab on the baseboard are spaced apart from each other, and the support portions have cross sections, parallel to the plane of the baseboard, with different areas from each other; and
   in forming the recess, forming a portion of the recess matching the plane pattern of the fixing tab in the etching process so that the cross sections of the respective support portions have different areas from each other.

5. The method for manufacturing a probe according to claim 1, wherein
   the fixing tab connected to the probe includes a plurality of support plates and one or more connecting portions interconnecting the support plates;
   in forming the recess, forming a portion of the recess matching the fixing tab connected to the probe matching the plane pattern of the fixing tab having the support plates and the one or more connecting portions; and
   in the etching process, maintaining the sacrificial layer between the baseboard and each of the support plates.

6. The method for manufacturing a probe according to claim 5, wherein each of the connecting portions has a shape selected from the group consisting of a straight line, a curved line, and a combination of a straight line and a curved line.

7. The method for manufacturing a probe according to claim 1, wherein
   the fixing tab connected to the probe includes a first support plate connected to the probe and a second support plate connected to the first support plate,
   the first support plate and the second support plate each have a plane pattern for leaving the portions of the sacrificial layer between the baseboard and the first support plate and the second support plate when the sacrificial layer between the baseboard and the probe is removed in the etching process;
   in forming the recess, forming the recess to match the plane pattern of the probe and the fixing tab which has the first support plate and the second support plate;
   in the etching process, fully removing the sacrificial layer between the baseboard and the probe, while leaving portions of the sacrificial layer between the baseboard and the first support plate and the second support plate, so that the probe and the fixing tab are both supported on the baseboard by portions of the sacrificial layer remaining between the baseboard and the first support plate and the second support plate; and
   the probe is removed from the baseboard by separating a linkage between the probe and the first support plate of the fixing tab.

8. The method for manufacturing a probe according to claim 7, wherein
   the fixing tab is connected to the probe by a first connecting portion;
   the fixing tab has a second connecting portion, which connects the first support plate to the second support plate;
   the second connecting portion has a shape selected from the group consisting of a straight line, a curved line and a combination of a straight line and a curved line; and
   in forming the recess, forming a portion of the recess matching the fixing tab to match the plane pattern of the fixing tab having the first support plate, the second support plate, and the second connecting portion.

9. The method for manufacturing a probe according to claim 7, wherein,
in the etching process,
leaving the sacrificial layer between the baseboard and each of the first support plate and the second support plate,
leaving a plurality of portions of the sacrificial layer between the baseboard and at least one of the first support plate and the second support plate, the portions being spaced apart from each other; and
the probe and the fixing tab are located on the baseboard and supported with three or more portions of the sacrificial layer that remain between the baseboard and the first support plate and the second support plate.

10. The method for manufacturing a probe according to claim 1, wherein,
the fixing tab connected to the probe includes a first support plate connected to the probe, a second support plate connected to the first support plate, and a third support plate connected to the second support plate;
the first support plate, the second support plate, and the third support plate each have a plane pattern that leaves the sacrificial layer between the baseboard and the first support plate, the second support plate, and the third support plate when the sacrificial layer between the baseboard and the probe is removed in the etching process;
in forming the recess, forming the recess to match the plane pattern of the probe and the fixing tab, which includes the first support plate, the second support plate, and the third support plate;
in the etching process, the sacrificial layer between the baseboard and the probe is fully removed, while portions of the sacrificial layer between the baseboard and the first support plate, the second support plate, and the third support plate are left, and the probe and the fixing tab are both supported on the baseboard by the portions of the sacrificial layer remaining between the baseboard and the first support plate, the second support plate, and the third support plate; and
removing the probe from the baseboard by separating a linkage between the probe and the first support plate of the fixing tab.

11. The method for manufacturing a probe according to claim 10, wherein
the fixing tab is connected to the probe by a first connecting portion;
the fixing tab has a second connecting portion, which connects the first support plate to the second support plate, and a third connecting portion, which connects the second support plate to the third support plate;
the second connecting portion and the third connecting portion each have a shape selected from the group consisting of a straight line, a curved line, and a combination of a straight line and a curved line; and
in forming the recess, forming a portion of the recess matching the fixing tab, to match the plane pattern of the fixing tab having the first support plate, the second support plate, the third support plate, the second connecting portion, and the third connecting portion.

12. The method for manufacturing a probe according to claim 5, wherein
the probe, as a whole, has a flat shape and includes a body, an arm section extending laterally from the body, and a probe tip section extending transverse to and from the arm section and having a contact end at a tip of the probe tip section;
the support plates each have an area larger than the area of the body; and
in forming the recess, forming the recess so that an area of a plane pattern of a portion matching the fixing tab is larger than an area of a plane pattern of a portion matching the body of the recess.

13. The method for manufacturing a probe according to claim 5, wherein
the probe, as a whole, has a flat shape and includes a body, an arm section extending laterally from the body, and a probe tip section extending transverse to and from the arm section and having a contact end at a tip of the probe tip section;
the fixing tab is connected to a side of the body of the probe; and
in forming the recess, forming the recess to match the plane pattern of the probe and so that the fixing tab is connected to the side of the body of the probe.

14. The method for manufacturing a probe according to claim 5, wherein
the probe, as a whole, has a flat shape and includes a body, an arm section extending laterally from the body, and a probe tip section extending transverse to and from the arm section and having a contact end at a tip of the probe tip section;
the arm section of the probe includes an opening between the body and the probe tip section, the opening passing through, in a thickness direction, the probe, and extending in a longitudinal direction of the arm section;
the fixing tab is located in the opening of the arm section of the probe and is connected to the probe;
in forming the recess, forming the recess to match the plane pattern of the probe and the fixing tab; and
the fixing tab is located in the opening of the arm section of the probe and is connected to the probe.

15. The method for manufacturing a probe according to claim 7, wherein
the probe, as a whole, has a flat shape and includes a body, an arm section extending laterally from the body, and a probe tip section extending transverse to and from the arm section and having a contact end at a tip of the probe tip section;
each of the first support plate and the second support plate has an area larger than the area of the body; and
in forming the recess, forming the recess so that an area of a plane pattern of a portion matching the fixing tab is larger than an area of a plane pattern of a portion matching the body of the recess.

16. The method for manufacturing a probe according to claim 7, wherein
the probe, as a whole, has a flat shape and includes a body, an arm section extending laterally from the body, and a probe tip section extending transverse to and from the arm section and having a contact end at a tip of the probe tip section;
the fixing tab is connected to a side of the body of the probe; and
in forming the recess, forming the recess to match the plane pattern of the probe and so that the fixing tab is connected to the side of the body of the probe.

17. The method for manufacturing a probe according to claim 7, wherein
the probe, as a whole, has a flat shape and includes a body, an arm section extending laterally from the body, and a probe tip section extending transverse to and from the arm section and having a contact end at a tip of the probe tip section;

the arm section of the probe includes an opening between the body and the probe tip section, the opening passing though, in a thickness direction, the probe, and extending in a longitudinal direction of the arm section;

the fixing tab is located in the opening of the arm section of the probe and is connected to the probe; and in forming the recess, forming the recess to match the plane pattern of the probe and the fixing tab, which is located in the opening of the arm section of the probe and connected to the probe.

* * * * *